(12) United States Patent
Nishida et al.

(10) Patent No.: US 6,704,914 B2
(45) Date of Patent: Mar. 9, 2004

(54) HIGH LEVEL SYNTHESIS METHOD, THREAD GENERATED USING THE SAME, AND METHOD FOR GENERATING CIRCUIT INCLUDING SUCH THREADS

(75) Inventors: Koichi Nishida, Tenri (JP); Kazuhisa Okada, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 32 days.

(21) Appl. No.: 10/195,740

(22) Filed: Jul. 16, 2002

(65) Prior Publication Data

US 2003/0028854 A1 Feb. 6, 2003

(30) Foreign Application Priority Data

Jul. 16, 2001 (JP) ........................................ 2001-215560

(51) Int. Cl.⁷ ............................................... G06F 17/50
(52) U.S. Cl. ............................................... 716/8; 716/1
(58) Field of Search ............................ 716/1–5, 16–18

(56) References Cited

U.S. PATENT DOCUMENTS 5,867,399 A * 2/1999 Rostoker et al. ............. 716/18
6,195,786 B1 * 2/2001 Raghunathan et al. ......... 716/2
6,581,187 B2 * 6/2003 Gupta et al. .................... 716/1

FOREIGN PATENT DOCUMENTS

| GB | 2 352 852 A | 2/2001 |
| JP | 05-101141 | 4/1993 |

* cited by examiner

*Primary Examiner*—Vuthe Siek
*Assistant Examiner*—Paul Dinh
(74) *Attorney, Agent, or Firm*—Harness, Dickey & Pierce, P.L.C.

(57) ABSTRACT

A high level synthesis method for generating a logic circuit of a register transfer level from an operation description includes a control data flowgraph generation stage; a scheduling stage; an allocation stage; a data path generation stage; and a control logic generation stage. When generating a thread sharing a common memory with another thread operating in parallel therewith, a memory access request is represented by a node of a control data flowgraph so as to perform scheduling, and a control logic is generated. The control logic outputs a memory access request signal to a common memory interface in a state corresponding to a step to which the node is scheduled, and keeps the state until a memory access request acceptance signal from the common memory interface is changed to be active.

8 Claims, 22 Drawing Sheets

```
a=mem(adr);     (101)
b=mem(adr+1);   (102)
c=mem(adr-1);   (103)
d=a+b+c;        (104)
```

Cycle0

Memory read request acceptance signal (MEM_RACK):active

Memory read request acceptance signal (MEM_RACK):inactive

Cycle1

Memory read request acceptance signal (MEM_RACK):inactive

Memory read request acceptance signal (MEM_RACK):active

Cycle2

Cycle3

US 6,704,914 B2

HIGH LEVEL SYNTHESIS METHOD, THREAD GENERATED USING THE SAME, AND METHOD FOR GENERATING CIRCUIT INCLUDING SUCH THREADS

BACKGROUND OF THE INVENTION

1. Field of the Invention

The present invention relates to a high level synthesis method for automatically generating a logic circuit of a register transfer level (RTL) from an operation description, a thread produced using the high level synthesis method, and a method for producing a circuit including the thread. The present invention is especially effective for designing of an ASIC (Application Specific Integrated Circuit) or other circuits which are required to be designed in a short period of time.

2. Description of the Related Art

A high level synthesis method automatically generates a logic circuit of an RTL which includes a hardware structure (registers, calculators and the like), data flow between registers per operation cycle, and processing, based on an operation description which describes only processing operations but does not include information on the hardware structure. This high level synthesis method is disclosed in, for example, Japanese Laid-Open Publication No. 6-101141. Hereinafter, a flow of such a conventional high level synthesis method will be described.

(i) Conversion of an operation description to a control data flowgraph (CDFG)

In high level synthesis, an operation description is first analyzed and converted to a model, referred to as a CDFG, which represents the dependency relationship among calculations, input to and output from an external device, and a memory access execution order.

FIG. 1 shows an exemplary operation description. The operation description shown in FIG. 1 is performed as follows. In a description 101, a memory content corresponding to address (adr) is substituted for a variable a. In a description 102, a memory content corresponding to address (adr+1) is substituted for a variable b. In a description 103, a memory content corresponding to address (adr−1) is substituted for a variable c. In a description 104, the value of (a+b+c) is substituted for a variable d.

FIG. 2 shows an exemplary CDFG obtained by converting the operation description shown in FIG. 1. In the CDFG shown in FIG. 2, a node 105 represents an input to the circuit from an external device, and a node 106 represents an output from the circuit to an external device. Nodes 107 through 109 each represent a read request to the memory (memory read request or memory access request), and nodes 110 through 112 each represent data read from the memory. A node 133 represents an increment, and a node 134 represents a decrement. Nodes 135 and 136 each represent an addition.

Branches 113 and 114 each represented by a chain line in FIG. 2 are each a data dependency edge (or control dependency edge). The data dependency edge 113 connects the node 107 to the node 108. The data dependency edge 114 connects the node 108 to the node 109. A node, to which another node is connected to, needs to be scheduled to a step later than the step to which the another node is scheduled. For example, in a scheduling stage described below, the node 108 is scheduled to a step later than the step to which the node 107 is scheduled. When a pipeline-accessible memory is used, the memory read requests 107 through 109 are executed in the same order as in the operation description and are scheduled to different steps from each other. Herein, the term "pipeline-accessible memory" is defined to refer to a memory which can request an access in each clock cycle. In the operation description shown in FIG. 1, memory read is performed three times. The data dependency edges 113 and 114 are provided so that these three memory read operations are performed in different steps in the order described.

Branches 117 through 119 each represented by a dashed line in FIG. 2 are each a data dependency edge. The data dependency edge 117 connects the node 107 to the node 110. The data dependency edge 118 connects the node 108 to the node 111. The data dependency edge 119 connects the node 109 to the node 112. A node, to which another node is connected to, needs to be scheduled to a step later by n steps than the step to which the another node is scheduled. Here, "n" represents a relative step number 120, 121 or 122 which is associated with each data dependency edge. For example, in the scheduling stage described below, the node 110 is scheduled to a step later by two steps than the step to which the node 107 is scheduled.

FIG. 3 is a timing diagram illustrating a read timing of a pipeline-accessible memory. When a memory which causes read data RDATA to be valid two clock cycles after a rise of a memory read request signal RREQ is used as shown in FIG. 3, the data dependency edges 117 through 119 each having a relative step number of 2 are provided. In this specification, a "memory which causes read data to be valid n clock cycles after a rise of a memory read request signal and also is pipeline-accessible" is referred to as a "pipeline memory having a latency of n".

Branches 123 through 132 each represented by a solid line in FIG. 2 are each a data dependency edge. The data dependency edge 123 connects the node 107 representing a read request to the memory to the node 105 representing a memory address which is input from an external device. The data dependency edge 126 connects the node 108 representing a read request to the memory to the node 133 representing an increment. The data dependency edge 124 connects the node 133 representing an increment to the node 105 representing a memory address which is input from the external device. The data dependency edge 127 connects the node 109 representing a read request to the memory and the node 134 representing a decrement. The data dependency edge 125 connects the node 134 representing a decrement to the node 105 representing a memory address which is input from the external device. The data dependency edge 128 connects the node 110 representing data read from the memory to the node 135 representing an addition. The data dependency edge 129 connects the node 111 representing data read from the memory to the node 135 representing an addition. The data dependency edge 130 connects the node 135 representing an addition to the node 136 representing an addition. The data dependency edge 131 connects the node 112 representing data read from the memory to the node 136 representing an addition. The data dependency edge 132 connects the node 136 representing an addition to the node 106 representing an output to an external device. The processing result is output to the external device through the node 106.

(ii) Scheduling

In the scheduling stage, each node of the CDFG is assigned to a time slot, referred to as a step, which corresponds to a state of a controller (finite state transfer machine).

FIG. 4 shows an exemplary result obtained by scheduling the CDFG shown in FIG. 2. In this example, each node is scheduled to one of five steps of steps 0 through 4. Calculations which are scheduled to different steps can share one calculator. For example, in FIG. 4, the node 135 representing an addition and the node 136 also representing an addition are scheduled to different steps from each other and thus can share one calculator. In the scheduling stage, the nodes are scheduled to the steps such that the number of hardware devices is as small as possible so as to reduce the cost.

(iii) Allocation

In an allocation stage, calculators, registers and input and output pins which are required to execute the scheduled CDFG are generated. Nodes representing calculations of the CDFG are allocated to the calculators. Data dependency edges crossing the borders between the steps are allocated to the registers. External inputs and outputs and memory accesses are allocated to the input and output pins.

FIG. 5 shows an exemplary manner of allocation. In this example, an incrementor 137, a decrementor 138 and an adder 139 are generated. As represented by a dashed line in FIG. 5, the node 133 representing an increment is allocated to the incrementor 137, the node 134 representing a decrement is allocated to the decrementor 138, and the nodes 135 and 136 representing an addition are allocated to the adder 139.

A register 140 is also generated. As represented by a dashed line in FIG. 5, the data dependency edges 124, 125, 128 and 130 crossing the borders between the steps are allocated to the register 140.

Input pins 141 and 142 and output pins 143 and 144 are generated. As represented by a dashed line in FIG. 5, the node 105 (input from an external device) is allocated to the input pin 141, and the node 106 (output to an external device) is allocated to the output pin 144. The nodes 107 through 109 (memory read requests) are allocated to the output pin 143, and the nodes 110 through 112 (read data) are allocated to the input pin 142.

(iv) Generation of a data path

In a data path generation stage, data paths corresponding to the data dependency edges of the CDFG are generated, and selectors are generated when necessary.

FIG. 6 shows an exemplary manner of data path generation. In the example shown in FIG. 6, as represented by a dashed line, paths 145 and 146 from the input pin 141 (to which the node 105 (external input) is allocated) to the output pin 143 (to which the node 107 (memory read request) is allocated) are generated in correspondence with the data dependency edge 123 from the node 105 (external input) to the node 107 (memory read request).

Also as represented by a dashed line in FIG. 6, paths 147 and 148 from the input pin 141 (to which the node 105 (external input) is allocated) to the register 140 (to which the data dependency edge 124 is allocated) and a path 149 from the register 140 (to which the data dependency edge 124 is allocated) to the incrementor 137 (to which the node 133 (increment) is allocated) are generated in correspondence with the data dependency edge 124 from the node 105 (external input) to the node 133 (increment).

As represented by a dashed line in FIG. 6, paths 150 and 148 from the input pin 142 (to which the node 110 (read data) is allocated) to the register 140 (to which the data dependency edge 128 is allocated) and a path 151 from the register 140 (to which the data dependency edge 128 is allocated) to the adder 139 (to which the node 135 (addition) is allocated) are generated in correspondence with the data dependency edge 128 from the node 110 (read data) to the node 135 (addition).

In a similar manner, the following data paths are generated: a data path corresponding to the data dependency edge from the node 105 (external input) to the node 134 (decrement), a data path corresponding to the data dependency edge from the node 133 (increment) to the node 108 (memory read request), a data path corresponding to a data dependency edge from the node 134 (decrement) to the node 109 (memory read request), a data path corresponding to a data dependency edge from the node 111 (read data) to the node 135 (addition), a data path corresponding to a data dependency edge from the node 112 (read data) to the node 136 (addition), and a data path corresponding to a data dependency edge from the node 136 (addition) to the node 106 (external output).

In the case where the calculators, registers and output pins and the like are shared as in this example, selectors 152 and 153 are generated for selecting data which is to be input to the calculators, registers, output pins and the like.

(v) Generation of a control logic

In a control logic generation stage, a control logic for controlling the registers, selectors and the like generated in the allocation stage and the data path generation stage is generated.

FIG. 7 shows exemplary manner of control logic generation.

(1) Generation of input and output pins for a control logic

As input and output pins for a control logic, an input pin 154 for receiving a clock signal and an output pin 155 for outputting a memory read request are generated. When the memory read request is output, a memory address is output from the output 143 and the memory read request is output from the output pin 155.

(2) Generation of a finite state transfer machine

Next, a finite state transfer machine is generated as follows. The same number of states 403 through 407 (S0 through S4) as the total number of the steps in the scheduling result are generated. Then, state transfer logics 408 through 411 are generated such that the state is transferred sequentially from S0 in each clock cycle, under the condition that a state corresponding to one step is transferred to a state corresponding to the next step when the finite state transfer machine is active. After that, state output logics and state output pins 158 through 162 are generated. Each of the state output pins 158 through 162 becomes active when having a value corresponding to its respective state, and becomes inactive when having a value corresponding to any other state.

(3) Generation of a memory read request signal logic

As can be appreciated from the above-described scheduling result, a memory read is requested in state S0 corresponding to step 0, state S1 corresponding to step 1, and state S2 corresponding to step 2. Accordingly, a logic 163 is generated such that when one of states S0, S1 and S2 respectively output from the state output pins 158, 159 and 160 of the finite state transfer machine 156 is active, the output from the output pin 155 is active.

(4) Generation of a selector selection logic

As can be appreciated from the above-described scheduling, allocation and data path generation results, in step 0, the paths 145 and 146 from the input pin 141 to the output pin 143 are used. Therefore, a logic 165 is generated such that when state S0 which is output from the state output pin 158 of the finite state transfer machine 156 is active, an input 164, of the selector 153, connected to the input pin 141 via the path 145 is selected.

The logic 165 may alternatively be generated such that when states S1 and S2 which are respectively output from the state output pins 159 and 160 of the finite state transfer machine 156 are active, an input connected to the incrementor and an output connected to the decrementor are respectively selected. Similarly regarding the selector 152, a logic is generated such that when states S0, S2 and S3 which are respectively output from the state output pins 158, 160 and 161 of the finite state transfer machine 156 are active, an input connected to the input pin 141 via the path 145, an input connected to the input pin 142 via the path 150, and an input connected to the adder 139 are respectively selected. Regarding a logic (OR) connected to the register 140, a logic is generated such that when states SO through S3 are active, the register 140 becomes active.

In the above-described manner, the logic circuit of an RTL is generated from an operation description.

A circuit configuration, in which a plurality of threads operating in parallel share a memory, will be described. Herein, a "thread" refers to a "circuit having an independent finite state transfer machine". In the case where each thread is independently generated by the above-described conventional high level synthesis method in such a circuit configuration, access competition occurs when the plurality of threads access the shared, common memory simultaneously. As a result, correct memory access is not performed.

SUMMARY OF THE INVENTION

According to one aspect of the invention, a high level synthesis method for generating a logic circuit of a register transfer level from an operation description is provided. The method includes a control data flowgraph generation stage of analyzing the operation description describing a processing operation and not including information regarding a hardware structure, and generating a control data flowgraph which represents a dependency relationship among calculations, input to and output from an external device, and a memory access execution order; a scheduling stage of scheduling each of a plurality of nodes of the control data flowgraph to a step corresponding to a state of a controller; an allocation stage of generating a calculator, a register, and input and output pins which are required to execute the scheduled control data flowgraph, and allocating a calculation of the control data flowgraph to the calculator, allocating a data dependency edge crossing a border between steps to the register, and allocating an external input, an external output and a memory access to the input and output pins; a data path generation stage of generating a data path corresponding to the data dependency edge of the control data flowgraph and generating a selector when necessary; and a control logic generation stage of generating a control logic for controlling the register and the selector generated in the allocation stage and the data path generation stage. When generating a thread sharing a common memory with another thread operating in parallel therewith, a memory access request is represented by a node of the control data flowgraph so as to perform scheduling, and a control logic is generated, which outputs a memory access request signal to a common memory interface in a state corresponding to a step to which the node is scheduled, and which keeps the state until a memory access request acceptance signal from the common memory interface is changed to be active.

In one embodiment of the invention, the high level synthesis method further includes the stage of generating a read data storage and selection circuit, which includes a read data storage circuit for temporarily storing data which is read from the common memory and a read timing generation circuit for generating a timing for reading the data from the common memory.

In one embodiment of the invention, the read data storage and selection circuit includes a continuous transfer determination circuit for determining whether or not a finite state transfer machine included in the thread has been continuously transferred, and a read data selection circuit for selecting whether data which is read from the common memory is to be used or data which is stored in the read data storage circuit is to be used.

In one embodiment of the invention, the read data storage circuit includes a queue.

In one embodiment of the invention, the read timing generation circuit includes a shift register.

In one embodiment of the invention, the continuous transfer determination circuit includes a shift register.

According to another aspect of the invention, a thread generated using the above-described high level synthesis method is provided.

According to still another aspect of the invention, a method for generating a circuit including a plurality of threads which are generated using a high level synthesis method according to claim 1 and a common memory interface connected to each of the plurality of threads is provided. The method includes the stages of generating the common memory interface for, when the plurality of threads send a read request signal, accepting a read request signal from a thread having a highest priority, among the plurality of threads having an active read request signal, and changing a request acceptance signal to the selected thread to be active; generating the plurality of threads; and connecting the plurality of threads with the common memory interface.

According to the present invention, when a plurality of threads operating in parallel access a common memory simultaneously, mediation can be performed such that access competition among the plurality of threads does not occur.

In an embodiment in which the read data storage and selection circuit including the read data storage circuit and the read timing generation circuit are generated, data which is read from the memory with the correct timing is once stored in the read data storage circuit. Therefore, the thread can read data stored in the read data storage circuit whenever necessary.

In an embodiment in which the read data storage circuit includes the queue and an embodiment in which the read timing generation circuit includes the shift register, the area of the circuit is reduced.

In an embodiment in which the read data storage and selection circuit includes the continuous transfer determination circuit and the read data selection circuit, it is determined whether or not the finite state transfer machine included in the thread has been continuously transferred. Based on the determination result, either one of the data read from the memory or the data stored in the read data storage circuit is selected. Therefore, the memory access can be performed with a latency which is equal to the latency of the memory.

In an embodiment in which the continuous transfer determination circuit includes the shift register, the area of the circuit is reduced.

Thus, the invention described herein makes possible the advantages of providing a high level synthesis method for preventing access competition among a plurality of threads when the plurality of threads operating in parallel simultaneously access a common memory, a thread generated using the high level synthesis method, and a circuit including a plurality of threads generated using the high level synthesis method.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Example 1

Figure 8:
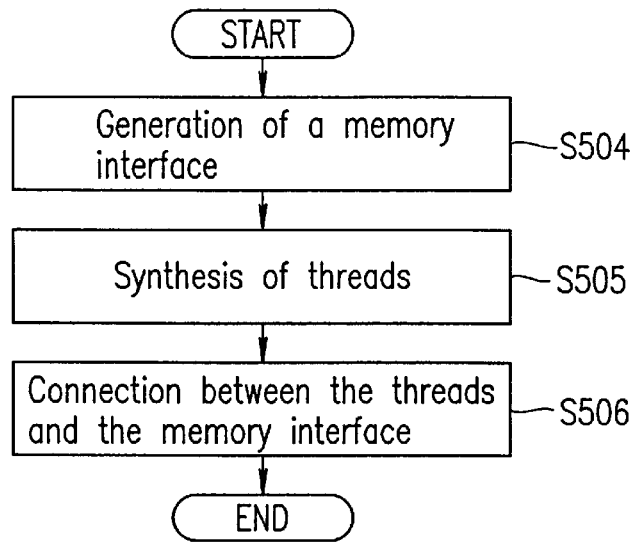
FIGS. 8 through 11 are each a flowchart illustrating a method for generating a circuit according to a first example of the present invention.

FIG. 8 is a flowchart illustrating a method for generating a circuit according to a first example of the present invention. In this example, a circuit is generated, which includes a plurality of threads for accessing a common memory and a common memory interface which is connected to each of the threads, and can adjust or mediate access competition among the plurality of threads.

In a stage of memory interface generation (S504), a memory interface is generated. The memory interface operates as follows. When a memory read request signal is input from the plurality of threads, the memory interface accepts a request from the thread having the highest priority level among the threads having a memory read request signal of "1" (active). The memory interface immediately changes a memory read request acceptance signal to the thread to be "1" (active) so as to notify the thread that the request has been accepted. After a rise of the n'th clock cycle, the memory interface outputs data, which has been input from a memory, to a read data pin. Here, "n" represents a latency of the memory.

In a stage of thread synthesis (S505), threads of an RTL (register transfer level) are independently generated by a high level synthesis method.

Figure 9:
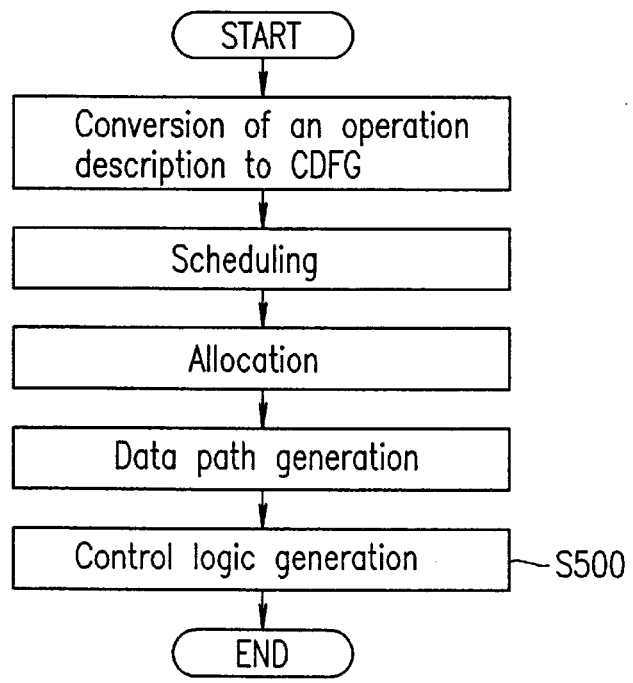

FIG. 9 is a flowchart illustrating a high level synthesis method for generating the threads. As shown in FIG. 9, conversion of an operation description to CDFG, scheduling, allocation, data path generation, and control logic generation (S500) are performed in this order. The conversion of an operation description to CDFG, scheduling, allocation, and data path generation are substantially the same as those described regarding the conventional art with reference to FIGS. 1 through 6. The control logic generation (S500) is different from that of the conventional art.

Figure 7:
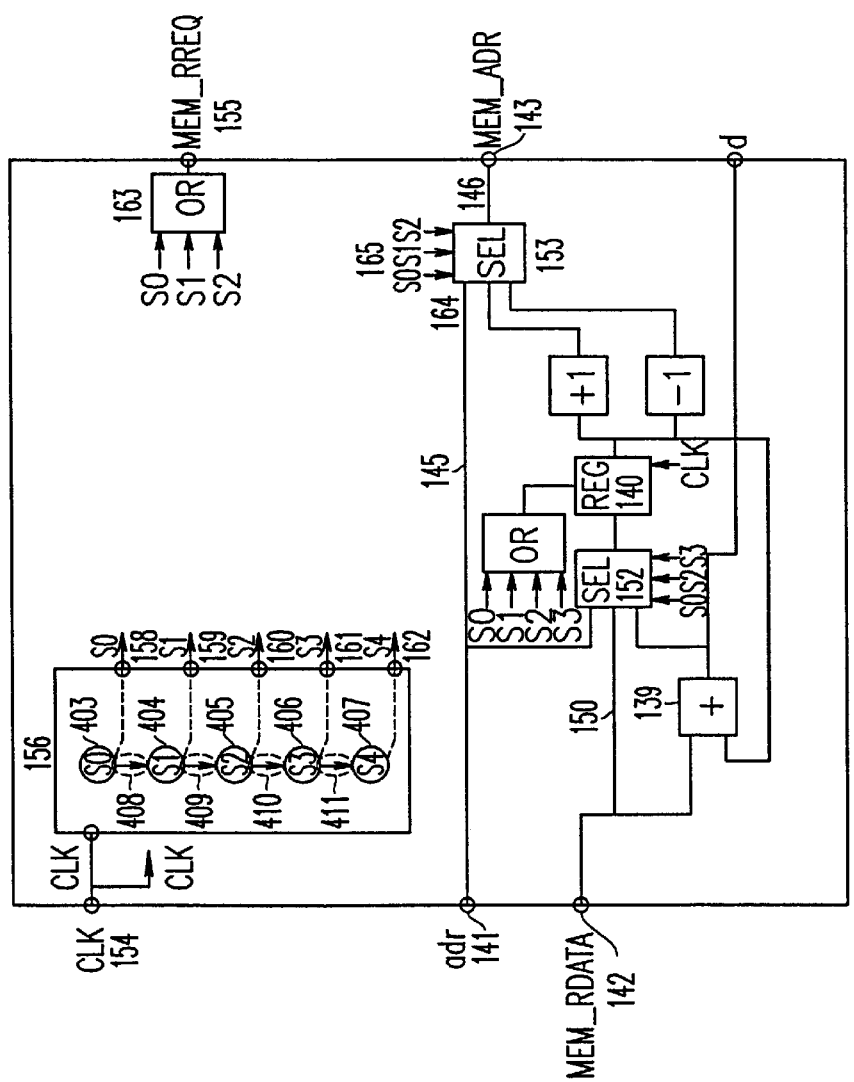
FIG. 7 shows exemplary control logic generation by high level synthesis.
Figure 10:
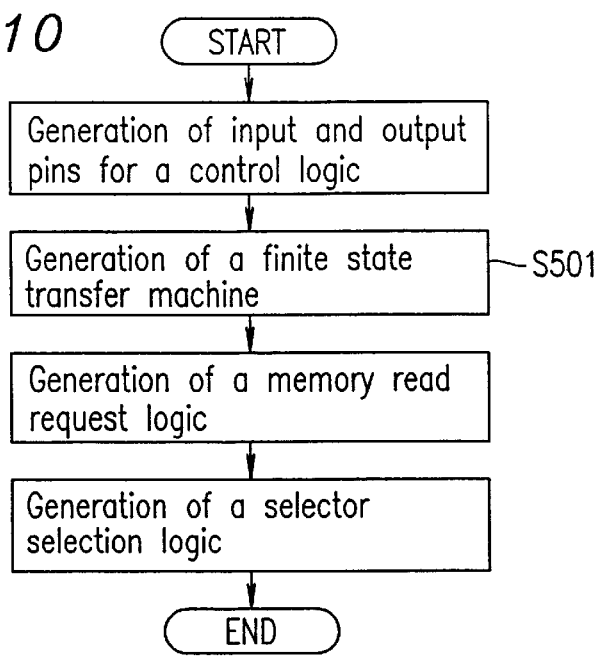

FIG. 10 is a flowchart illustrating the control logic generation (S500) according to the first example. As shown in FIG. 10, generation of input and output pins for a control logic, generation of a finite state transfer machine (S501), generation of a memory read request logic, and generation of a selector selection logic are performed in this order. The generation of input and output pins for a control logic, generation of a memory read request logic, and generation of a selector selection logic are substantially the same as those described regarding the conventional art with reference to FIG. 7. The generation of a finite state transfer machine (S501) is different from that of the conventional art.

Figure 11:
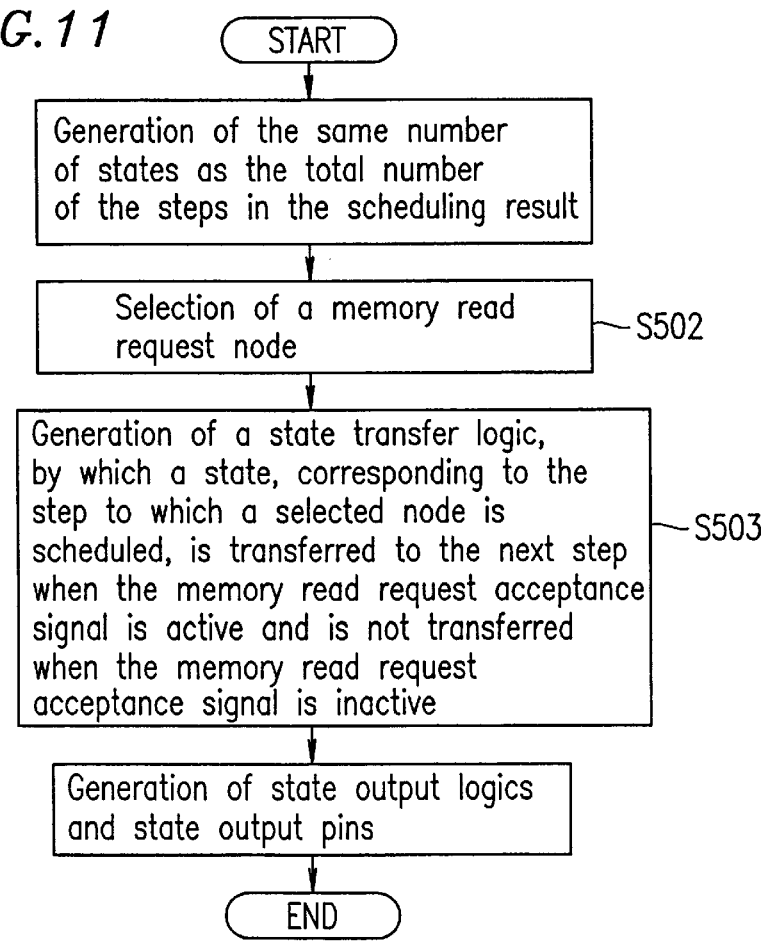

FIG. 11 is a flowchart illustrating the generation of a finite state transfer machine (S501) according to the first example. As shown in FIG. 11, generation of the same number of states as the total number of the steps in the scheduling result, selection of a memory read request node (S502), generation of a state logic (S503), and generation of state output logics and state output pins are performed in this order. The generation of the same number of states as the total number of the steps in the scheduling result, and generation of state output logics and state output pins are substantially the same as those described regarding the conventional art with reference to FIG. 7. The selection of a memory read request node (S502) and generation of a state logic (S503) are different from those of the conventional art.

In a stage of selection of a memory read request node (S502), a memory read request node for performing a mediation for read competition is selected. In a stage of generation of a state logic (S503), a state transfer logic is generated, by which a state, corresponding to the step to which the memory read request node is scheduled, to the next step when the memory read request acceptance signal is active and is not transferred when the memory read request acceptance signal is inactive. Thus, a memory read request signal is output from each thread to a memory interface, and a state transfer logic which is transferred to the next state when the memory read request signal input to the thread from the memory interface is "1" (active) and is not transferred when the memory read request signal is inactive is generated.

After that, in a stage of connection between the threads and the memory interface (S506 in FIG. 8), the threads generated are each connected to the memory interface.

With reference to FIGS. 12A through 12D, an operation of the circuit generated as above will be described. In this example, two threads, i.e., thread 1 and thread 2 are each connected to a memory interface. A pipeline memory (not shown) having a latency of 2 is accessed. Threads 1 and 2 request memory read in state S0, and perform memory read in state S2.

Figure 12A:
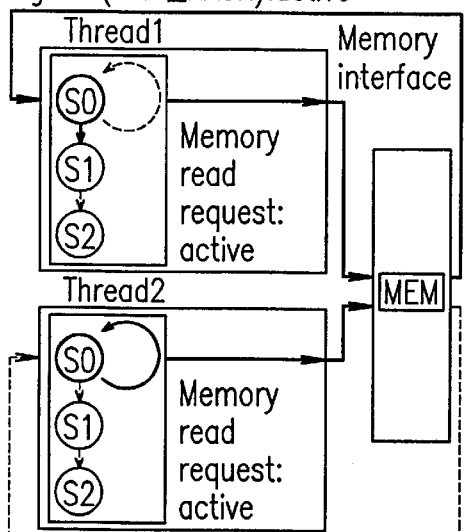
FIGS. 12A through 12D show an operation of a circuit generated in the first example of the present invention.
Figure 12B:
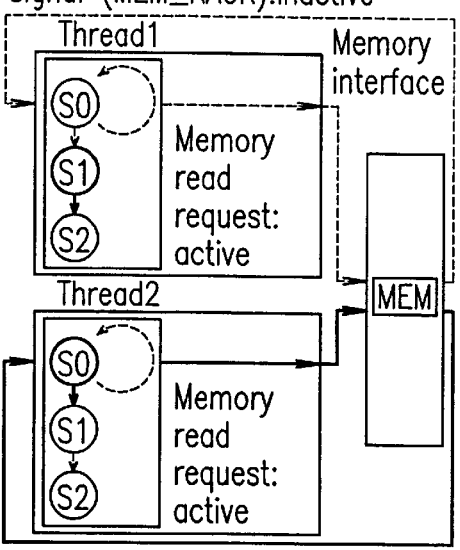

In cycle 0 shown in FIG. 12A, threads 1 and 2 are both in state S0. Therefore, threads 1 and 2 request memory read simultaneously. The memory interface accepts the request from thread 1 with priority, and changes a memory read request acceptance signal to thread 1 to be active.

In cycle 0, the memory read request acceptance signal from the memory interface to thread 1 is thus changed to be active. Therefore, in cycle 1 shown in FIG. 12B, thread 1 is placed into state S1. In cycle 0, a memory read request acceptance signal from the memory interface to thread 2 is kept inactive. Therefore, in cycle 1 shown in FIG. 12B, thread 2 is kept in state S0.

In cycle 1, thread 2 requests memory read again. Then, the memory interface accepts the request from thread 2, and changes the memory read request acceptance signal to thread 2 to be active.

Figure 12C:
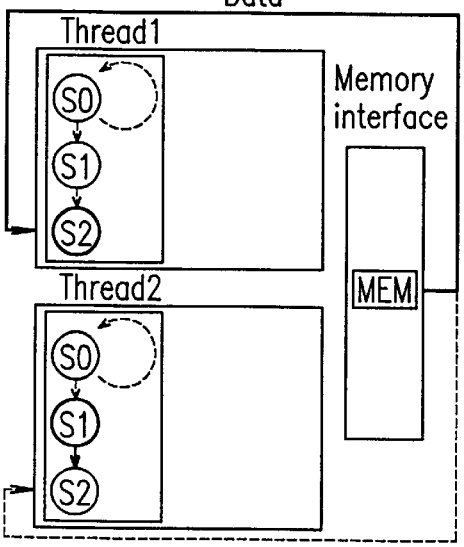
Figure 12D:
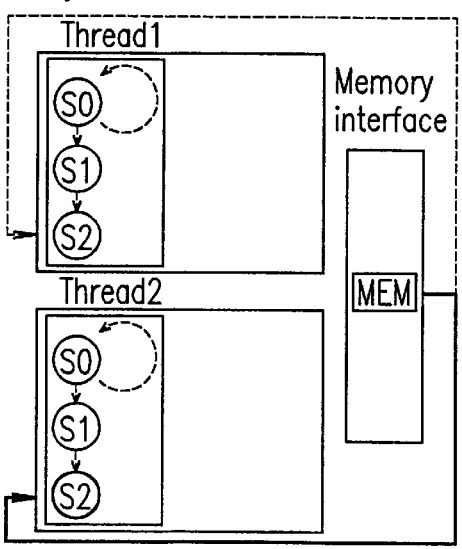

In cycle 2 shown in FIG. 12C, thread 1 reads data from the memory interface. In cycle 3 shown in FIG. 12D, thread 2 reads data from the memory interface.

As described above, in a circuit generated by the method according to the first example, it is determined whether or not each of the plurality of threads is to be transferred to the next state, based on a memory read request acceptance signal from the memory interface. Therefore, memory accesses from the plurality of threads can be mediated not to compete with each other.

Figure 13:
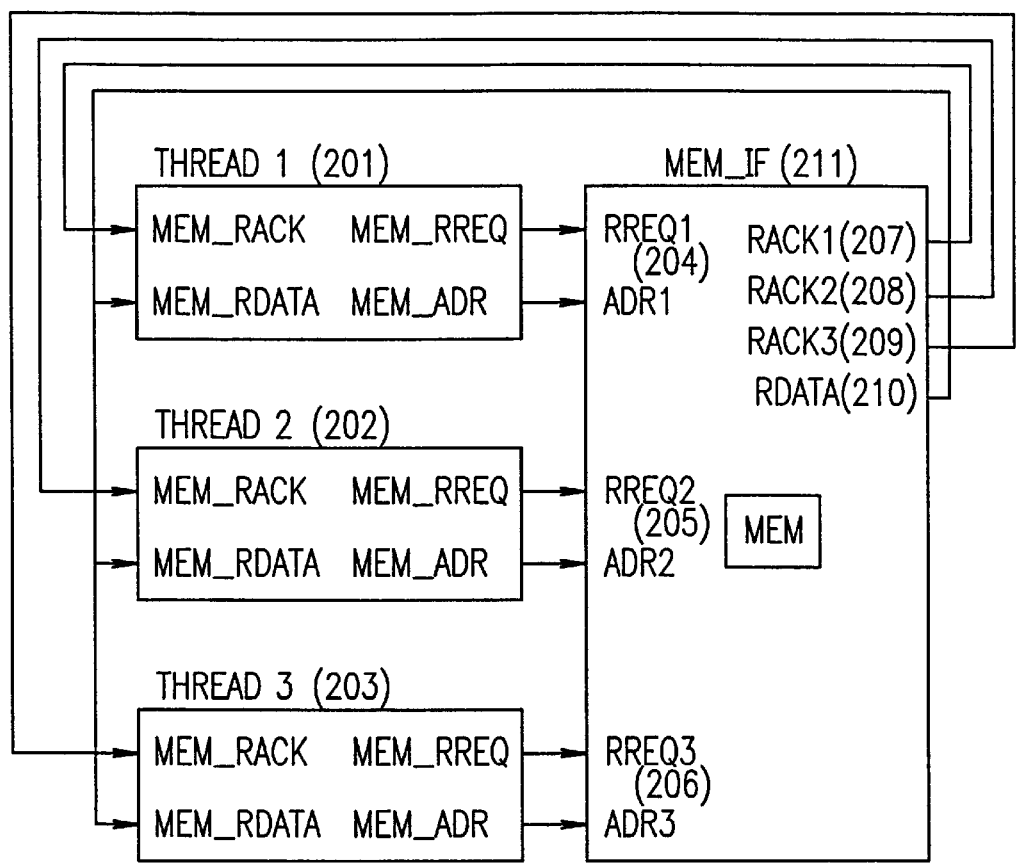
FIG. 13 shows a top layer of a circuit generated in the first example of the present invention.

FIG. 13 shows a top layer of a circuit generated in the first example which includes a plurality of threads and a memory interface.

In this example, three threads, i.e., threads 201 through 203 are each connected to a memory interface 211. The threads 201 through 203 respectively send memory read request signals 204 through 206 and addresses in a memory (not shown) at which the read request signals 204 through 206 are to be written, to the memory interface 211. The memory interface 211 accepts the request from the thread having the highest priority, among the threads which have sent the request signals, and immediately changes a memory read request acceptance signal to the selected thread to be "1" (active) so as to notify the thread that the request has been accepted. For example, the memory interface 211 changes a memory read request acceptance signal 207 to be active when the request from the thread 201 is accepted, changes a memory read request acceptance signal 208 to be active when the request from the thread 202 is accepted, and changes a memory read request acceptance signal 209 to be active when the request from the thread 203 is accepted. After a rise of the second clock cycle, the memory interface 211 outputs data from a memory (not shown) to a read data pin 210.

Figures 1, 2:
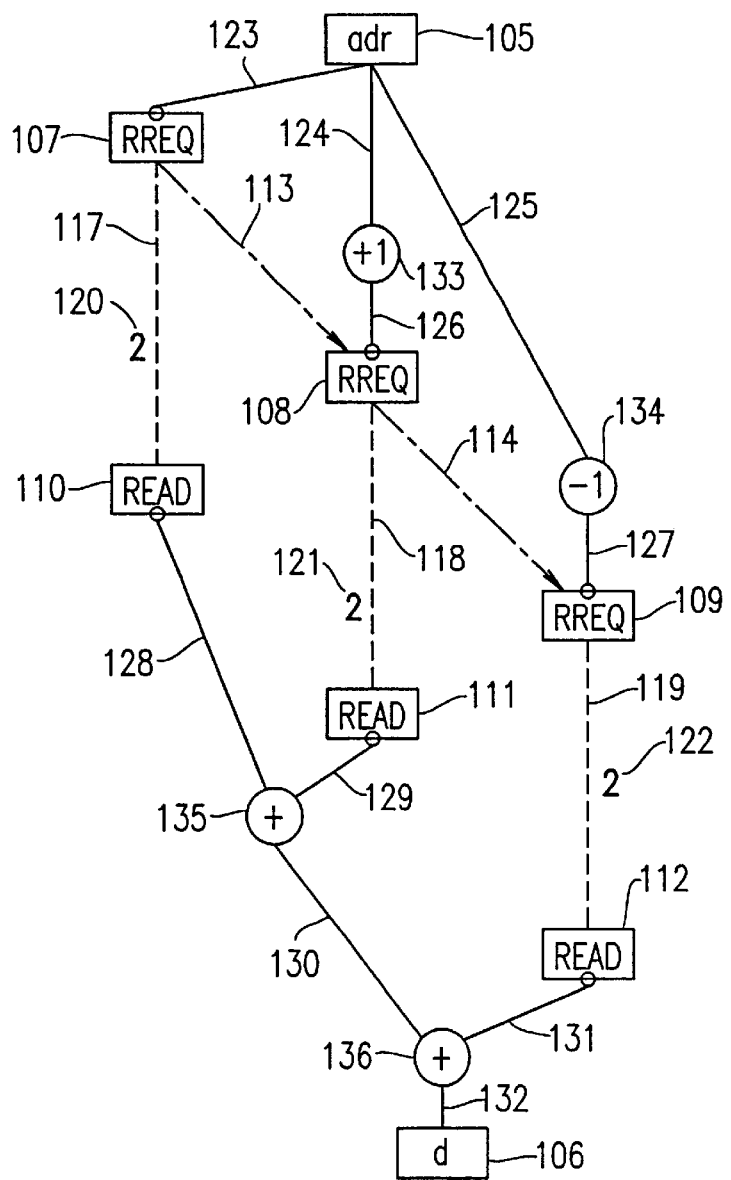
FIG. 1 shows an exemplary operation description by high level synthesis.
FIG. 2 shows an exemplary CDFG provided by high level synthesis.
Figure 3:
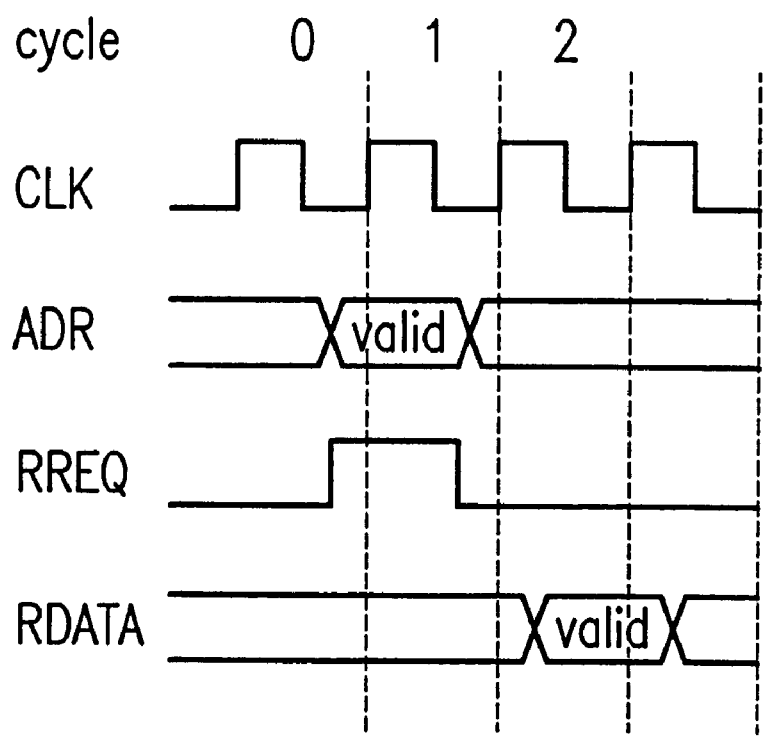
FIG. 3 is a timing diagram illustrating a read timing of a pipeline-accessible memory.
Figure 14:
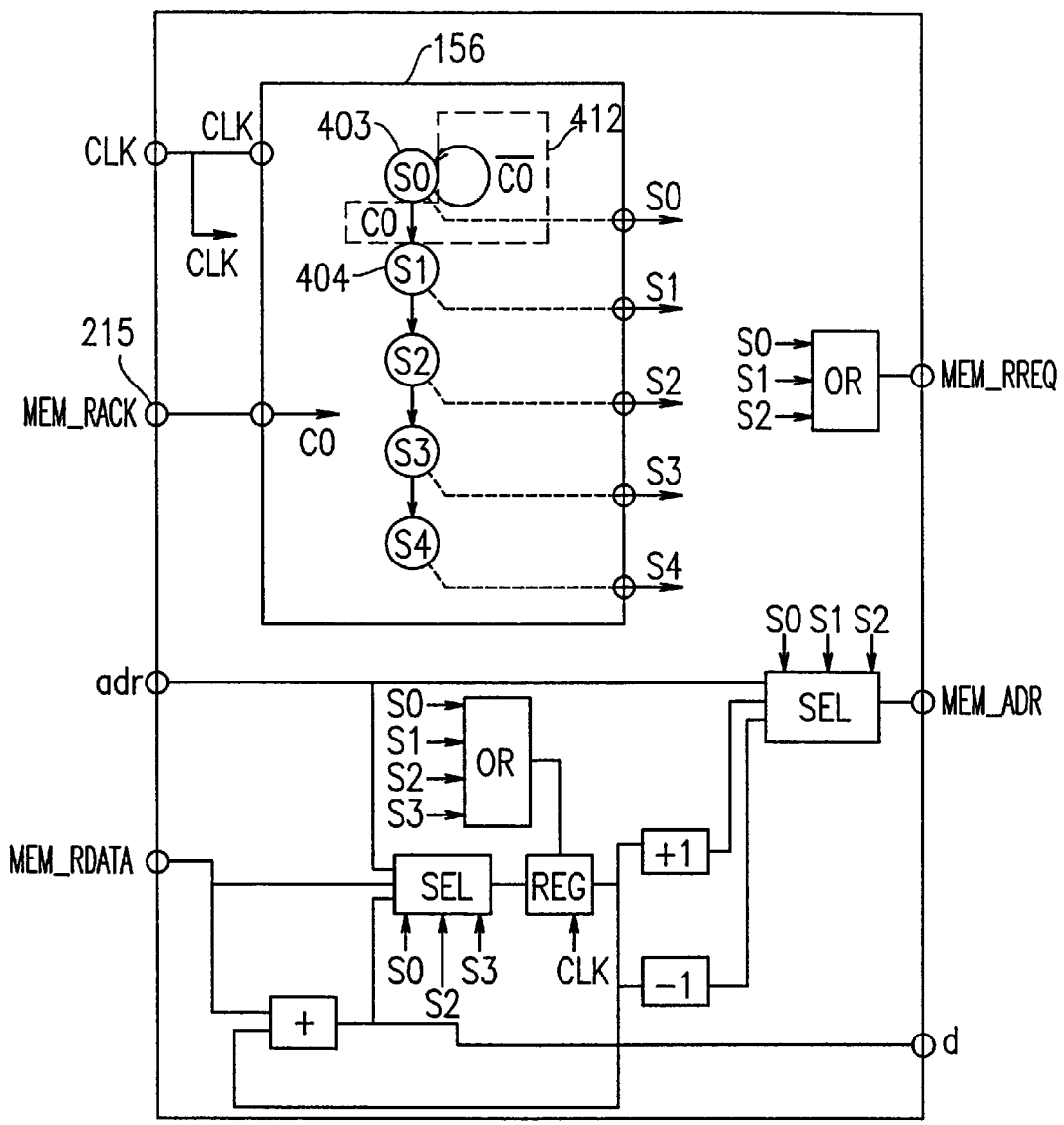
FIG. 14 shows a configuration of a thread generated in the first example of the present invention.

FIG. 14 shows an exemplary configuration of a thread generated from an operation description shown in FIG. 1 by the high level synthesis method according to the first example. As shown in FIG. 14, the thread includes a finite state transfer machine 156. Here, it is assumed that a pipeline memory having a latency of 2 is used. The CDFG obtained by converting the operation description (FIG. 1) is substantially the same as that shown in FIG. 2. The scheduling result is substantially the same as that shown in FIG. 4. The allocation result is substantially the same as that shown in FIG. 5. The data path generation result is substantially the same as that shown in FIG. 6.

In the thread shown in FIG. 14, a state transfer logic 412 is generated. When a memory read request acceptance signal MEM_RACK 215 is "1" or active (CO), the state transfer logic 412 is transferred from state S0 403, corresponding to the step to which the node 107 (memory read request) is scheduled, to state S1 404, corresponding to the next step. When the memory read request acceptance signal MEM_RACK 215 is inactive, the state transfer logic 412 is kept in state SO 403. The mediation for read competition is performed only to the node 107 (memory read request). Except for the above-described points, the thread shown in FIG. 14 has substantially the same configuration as that shown in FIG. 7.

As can be appreciated from the above, in a circuit generated by the method according to the first example, it is determined whether or not each of the plurality of threads is to be transferred to the next state, based on a memory read request acceptance signal from the memory interface. Therefore, memory accesses from the plurality of threads operating in parallel can be mediated not to compete with each other.

Figure 15:
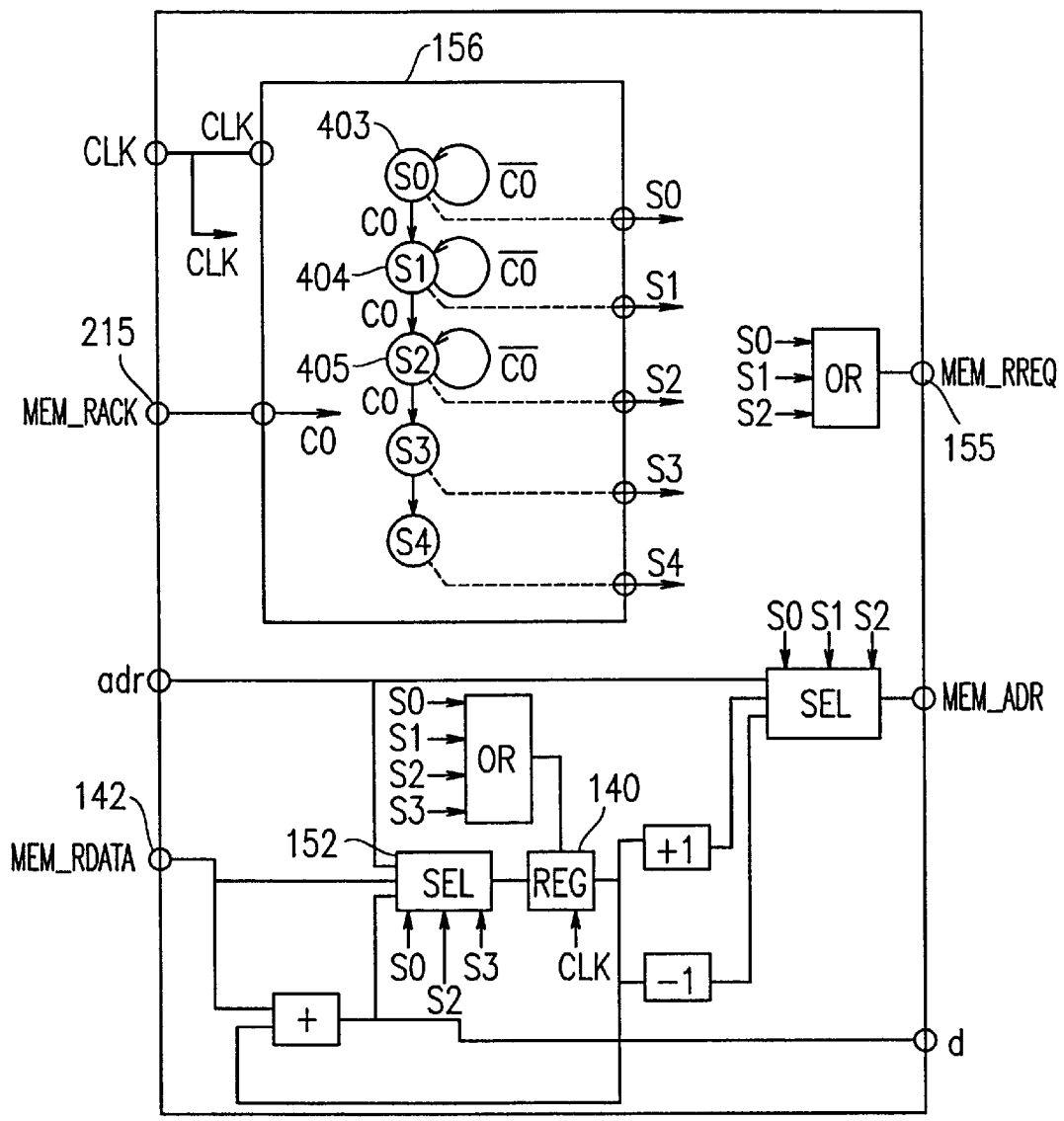
FIG. 15 shows a configuration of another thread generated in the first example of the present invention.

FIG. 15 shows another exemplary configuration of a thread generated by the high level synthesis method according to the first example. Here, it is assumed that mediation for read competition by the memory read request nodes 107 through 109 shown in FIG. 2 is performed.

A control logic generated in the thread shown in FIG. 15 operates as follows. When a memory read request acceptance signal 215 is "1" or active (CO), state S0 403, state S1 404, or state S2 405 respectively corresponding to the steps to which the nodes 107, 108 and 109 (memory read request) are scheduled, are transferred to the next state. When the memory read request acceptance signal 215 is inactive (/CO), the state is kept the same without being transferred.

When the memory interface 211 (FIG. 13) accepts a memory read request, data corresponding to the accepted memory read request is output to the read data pin 210 after a rise of the second clock. After that, data corresponding to another memory read request may possibly be output.

The finite state transfer machine 156 in state S0, S1 or S2 is kept the same unless the memory read request acceptance signal 215 from the memory interface is changed to be active. Therefore, data may possibly be output from the input pin 142 three clock cycles or more after the memory read request signal is output.

Figure 16:
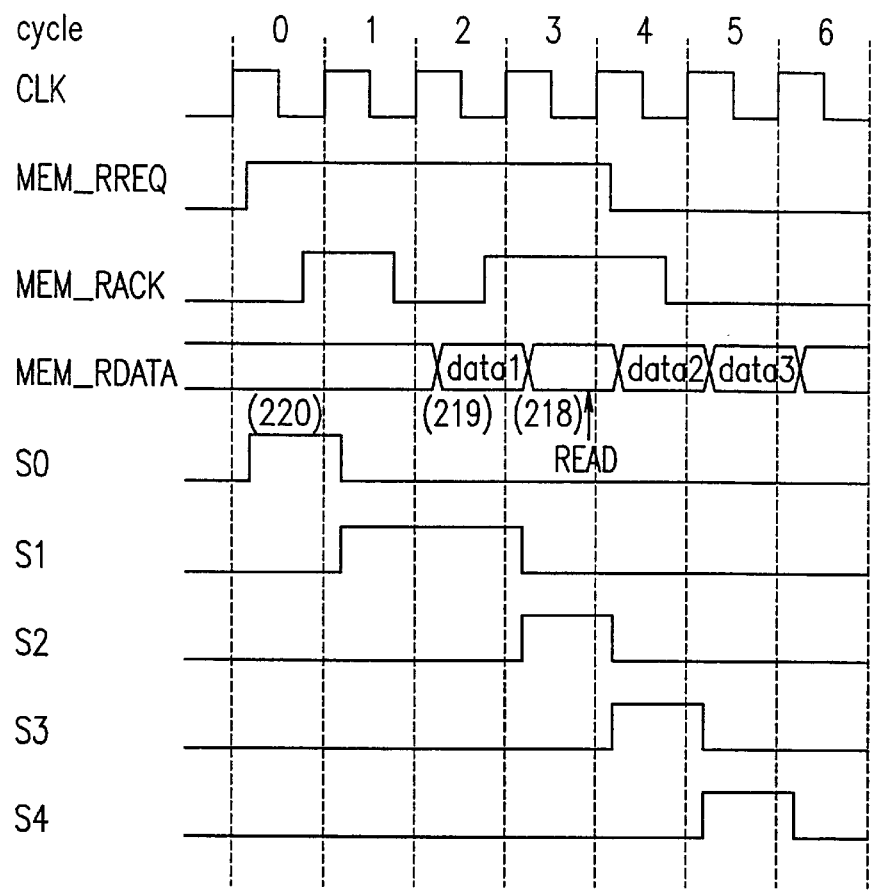
FIG. 16 is a timing diagram illustrating an operation timing of the thread shown in FIG. 15.

This phenomenon will be described with reference to FIGS. 15 and 16. FIG. 16 is a timing diagram illustrating an operation of the thread shown in FIG. 15.

In cycle 0, the thread is in state SO, and the thread changes the memory read request signal MEM_RREQ 155 to be "1"

(active). In cycle 0, the memory read request acceptance signal MEM_RACK 215 is changed to be "1" (active) immediately. Therefore, it is determined that the memory read request is accepted, and the thread is placed into state S1 in cycle 1.

In cycle 1, the thread changes the memory read request signal MEM_RREQ 155 to be "1" (active), but the memory read request acceptance signal MEM_RACK 215 is changed to be "0" (inactive). Therefore, the thread is kept in state S1 in cycle 2 without being placed into state S2.

In cycle 2, the memory read request acceptance signal MEM_RACK 215 is changed to be "1" (active). Therefore, the thread is placed into state S2 in cycle 3. In this state, the data corresponding to the first memory read request is read by the thread. However, the cycle is already cycle 3 at this time (time point 218), which is three cycles after a time point 220 when the first memory read request was made. Thus, the thread cannot read the correct read data 219. For this reason, in the circuit generated in the first example, data in the memory may possibly not be read with the correct timing. The account of this phenomenon is improved by a method for generating a circuit according to a second example of the present invention.

Example 2

Figure 17:
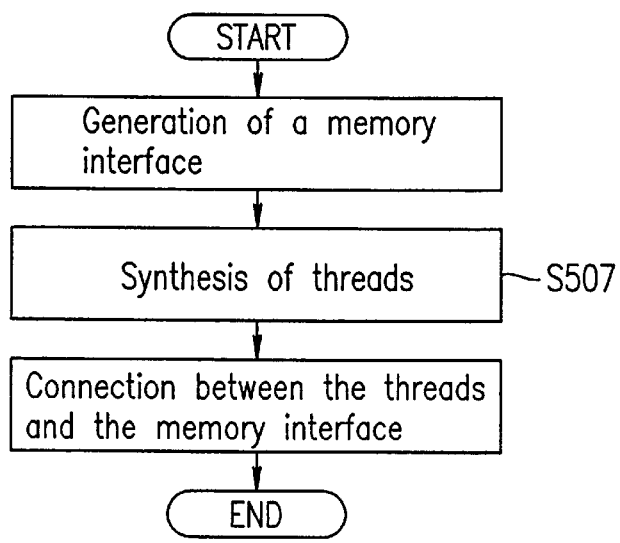
FIGS. 17 through 19 are each a flowchart illustrating a method for generating a circuit according to a second example of the present invention.

FIG. 17 is a flowchart illustrating a method for generating a circuit according to the second example of the present invention. A circuit generated in the second example includes a plurality of threads operating in parallel so as to access a common pipeline-accessible memory, and a memory interface which is connected to each of the threads. Data is read from a memory with the correct timing. The read data is once stored in a read data storage circuit including a queue. When required by a thread, the data stored in the queue is read. Thus, the common memory can be accessed in a pipeline manner, and memory access competition among the plurality of threads is mediated.

Referring to FIG. 17, generation of a memory interface, synthesis of threads (S507), and connection between the threads and the memory interface are performed in this order. The generation of a memory interface, and connection between the threads and the memory interface are substantially the same as those described in the first example with reference to FIG. 8. The synthesis of threads (S507) is different from that of the first example.

In a stage of synthesis of threads (S507), threads of an RTL (register transfer level) are independently generated by a high level synthesis method.

Figure 18:
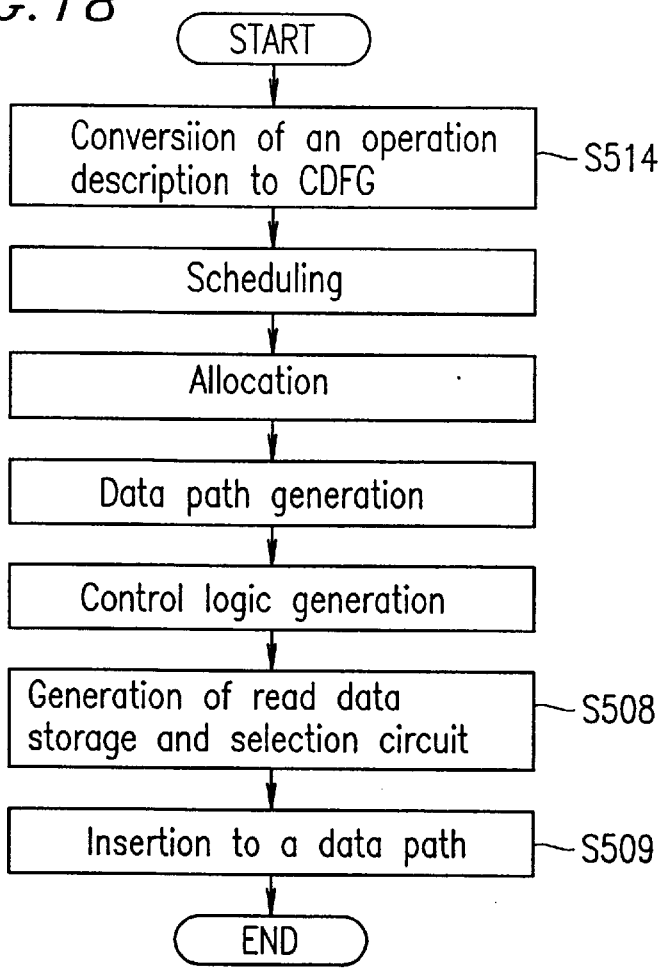

FIG. 18 is a flowchart illustrating a high level synthesis method for generating threads in the second example. As shown in FIG. 18, conversion of an operation description to CDFG (S514), scheduling, allocation, data path generation, control logic generation, generation of a read data storage and selection circuit (S508), and insertion to a data path (S509) are performed in this order. The scheduling, allocation, data path generation, and control logic generation are substantially the same as those described in the first example with reference to FIG. 9. The conversion of an operation description to CDFG (S514), generation of a read data storage and selection circuit (S508), and insertion to a data path (S509) are different from those of the first example.

The circuit generated in this example operates as follows. Data which is read from the memory via the memory interface is once stored in the read data storage circuit including a queue. Then, the data is read from the queue and used. Therefore, the read data node is scheduled to a step which is later by (n+1) steps than the memory read request node, in expectation of the overhead of one clock cycle. In a stage of conversion of the operation description to CDFG (S514), a data dependency edge having a relative step number of (n+1) is provided between the memory read request node and the read data node corresponding to the memory read request node. Except for this point, the conversion of the operation description to CDFG (S514) is substantially the same as that of the first example. Here, "n" represents a latency of the pipeline-accessible memory used.

In a stage of generation of a read data storage and selection circuit (S508), a read data storage and selection circuit for temporarily storing data which has been read from the memory via the memory interface is generated.

In a stage of insertion into a data path (S509), the generated read data storage and selection circuit is inserted into a data path.

Figure 19:
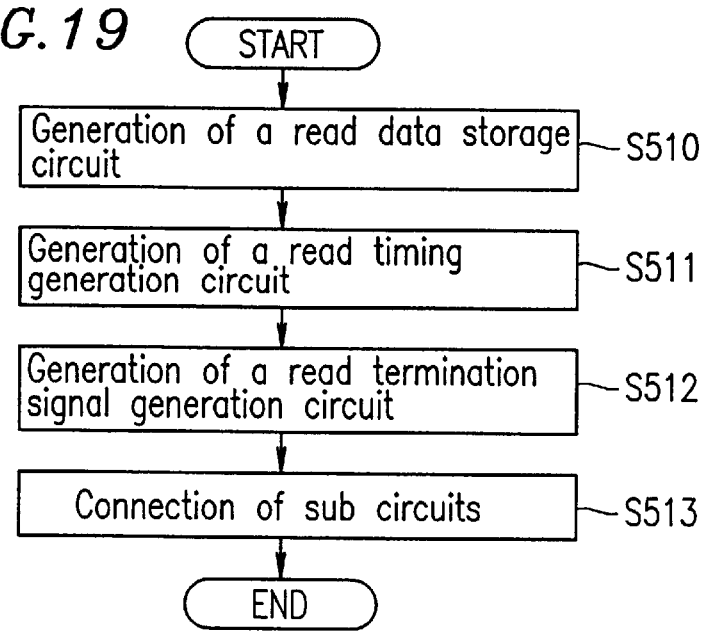

FIG. 19 is a flowchart illustrating the generation of a read data storage and selection circuit in the second example. As shown in FIG. 19, generation of a read data storage circuit (S510), generation of a read timing generation circuit (S511), generation of a read termination signal generation circuit (S512), and connection of sub circuits (S513) are performed in this order.

In a stage of generation of a read data storage circuit (S510), a queue for temporarily storing data which has been read from the memory interface is generated.

In a stage of generation of a read timing generation circuit (S511), a read timing generation circuit is generated for generating a timing for writing data from the memory interface to the queue n clock cycles after the memory read request is accepted by the memory interface. For generating the timing, a shift register is used. Here, "n" represents a latency of the pipeline-accessible memory.

In a stage of generation of a read termination signal generation circuit (S512), a read termination signal generation circuit is generated for changing the output to be active when the memory read is executed. A read termination signal is used for updating a reading pointer of the queue in order to read new data from the queue.

In a stage of connection of sub circuits (S513), the read data storage circuit, the read timing generation circuit and the read termination signal generation circuit are connected to each other so as to form the read data storage and selection circuit.

Figure 20:
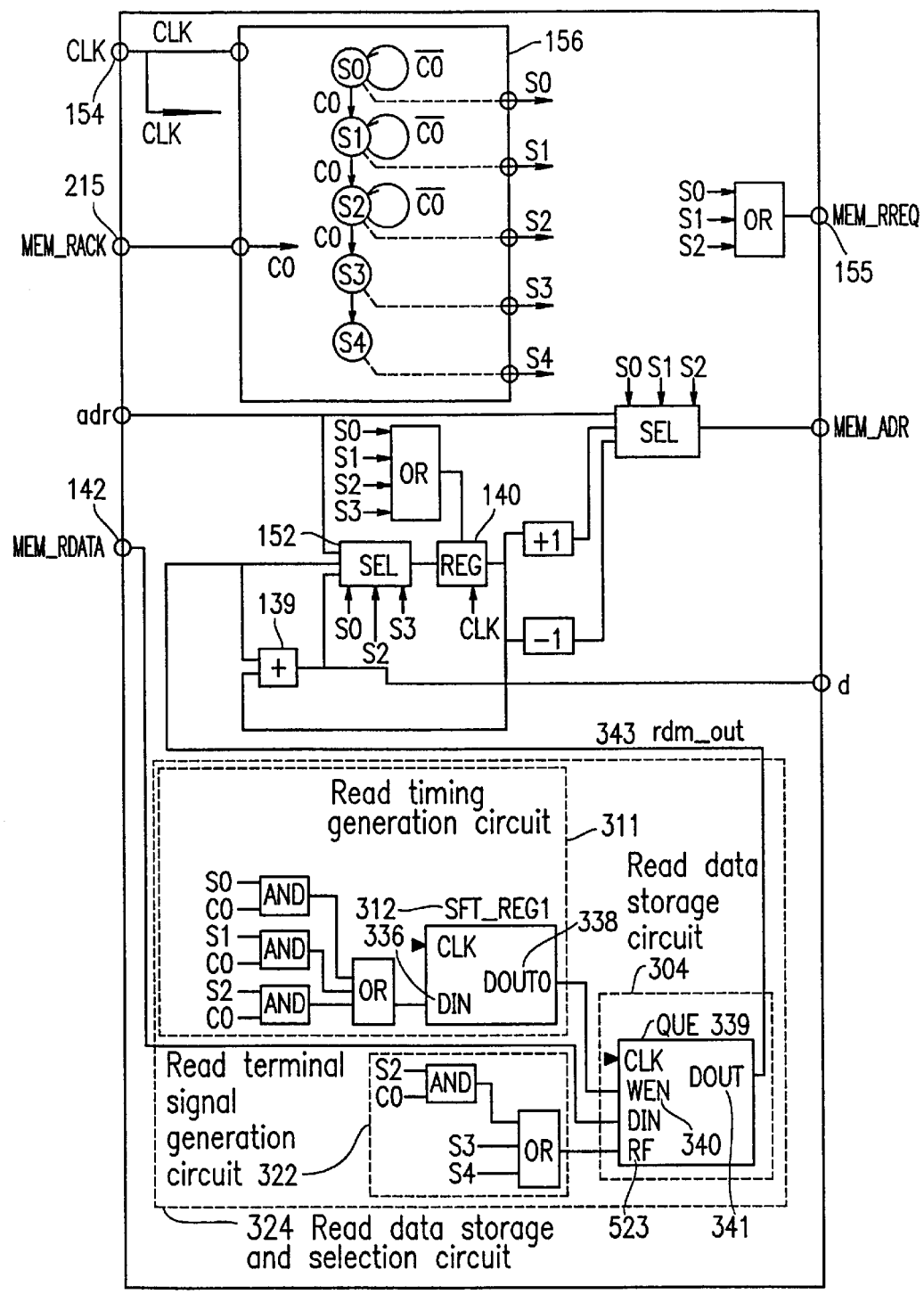
FIG. 20 shows a configuration of a thread generated in the second example of the present invention.

FIG. 20 shows an exemplary configuration of a thread generated by the high level synthesis method according to the second example. Here, it is assumed that a pipeline memory having a latency of 1 is used. In this case, the read data node is scheduled to a step which is later by two steps than the memory read request node. Therefore, the scheduling result is substantially the same as that in FIG. 4, the allocation result is substantially the same as that in FIG. 5, and the data path generation result is substantially the same as that in FIG. 6.

The thread shown in FIG. 20 includes, in addition to the circuit shown in FIG. 15, a read data storage and selection circuit 324. The read data storage and selection circuit 324 includes a read timing generation circuit 311, a read data storage circuit 304, and a read termination signal generation circuit 322.

The read timing generation circuit 311 includes three AND circuits, an OR circuit and a shift register 312. Two inputs of a first AND circuit respectively receive state S0 which is output from the finite state transfer machine 156 and a memory read request acceptance signal MEM_RACK (CO). Two inputs of a second AND circuit respectively receive state S1 which is output from the finite state transfer machine 156 and the memory read request acceptance signal MEM_RACK (CO). Two inputs of a third AND circuit respectively receive state S2 which is output from the finite state transfer machine 156 and the memory read request acceptance signal MEM_RACK (CO). An output of each AND circuit is connected to an input of the OR circuit. An output of the OR circuit is connected to an input DIN 336 of the shift register 312. An input CLK of the shift register 312 receives a clock signal.

The read termination signal generation circuit 322 includes an AND circuit and an OR circuit. Two inputs of the AND circuit respectively receive state S2 and a memory read request acceptance signal MEM_RACK (CO). An output of the AND circuit is connected to an input of the OR circuit. The OR circuit also receives state S3 and state S4 which are output from the finite state transfer machine 156.

The read data storage circuit 304 includes a queue 339. An input WEN 340 of the queue 339 is connected to an output DOUT0 338 of the shift register 312 included in the read timing generation circuit 311. An input DIN of the queue 339 is connected to the input pin 142 for receiving read data MEM_RDATA. An input RF 523 of the queue 339 is connected to an output of the OR circuit included in the read terminal signal generation circuit 322. An input CLK of the queue 339 receives a clock signal. An output DOUT 341 of the queue 339 is connected to an output rdm_out 343 of the read data storage and selection circuit 324. The output 343 of the read data storage and selection circuit 324 is connected to one of the inputs of the adder 139 and also to an input of the selector 152.

Figure 21:
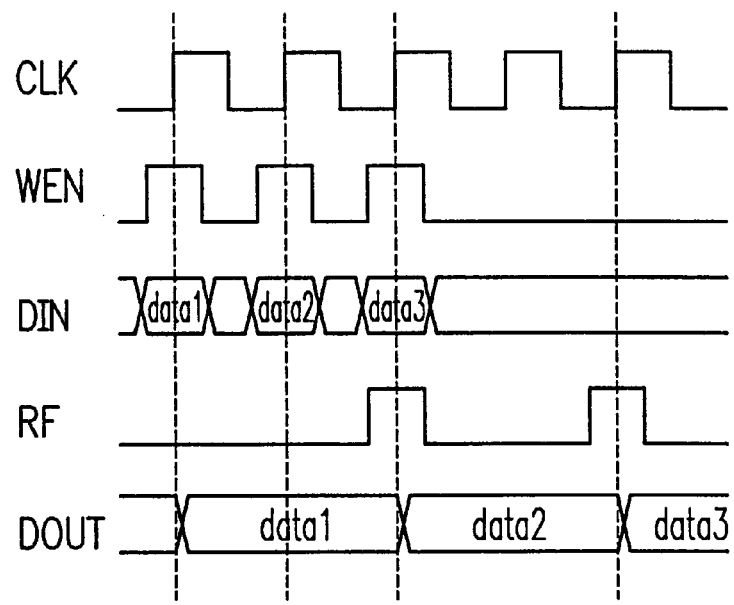
FIG. 21 is a timing diagram illustrating an operation timing of a queue in a circuit generated in the second example of the present invention.

FIG. 21 is a timing diagram illustrating an access timing of the queue 339. When read data is supplied to the input DIN of the queue 339 and thus the input WEN of the queue 339 becomes "1", the data is written in the queue 339 at the time of a rise of the next signal input to the input CLK of the queue 339. In the example shown in FIG. 21, three data strings, i.e., data1, data2 and data3 are sequentially written.

The output DOUT 341 of the queue 339 outputs a value currently represented by the reading pointer of the queue 339. When the input RF of the queue 339 becomes "1", the reading pointer of the queue 339 is moved at the time of a rise of the next signal input to the input CLK, and thus new data is output from the output DOUT 341. In the example shown in FIG. 21, initially data1 is output from the output DOUT 341. When the input RF 523 of the queue 339 becomes "1" for the first time and the signal input to the input CLK rises, data2 is output. When the input RF 523 of the queue 339 becomes "1" for the second time and the signal input to the input CLK rises, data3 is output.

Figure 22:
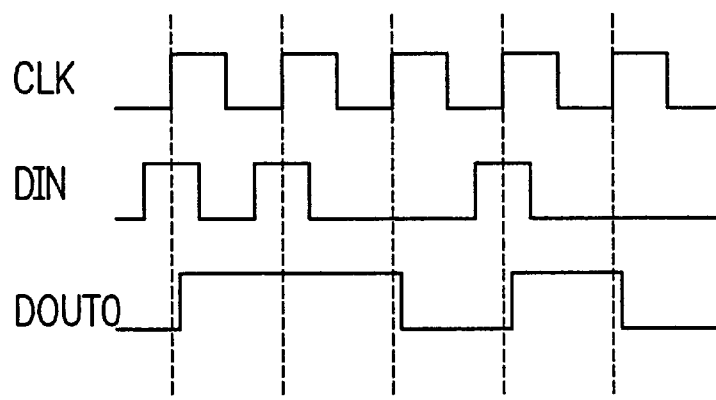
FIG. 22 is a timing diagram illustrating an operation timing of a shift register in a circuit generated in the second example of the present invention.

FIG. 22 is a timing diagram illustrating an access timing of the shift register 312. The shift register 312 is a one-bit shift register. Each time the signal input to the input CLK rises, a value of the signal input to the input DIN is substituted for the output DOUT0.

Figure 23:
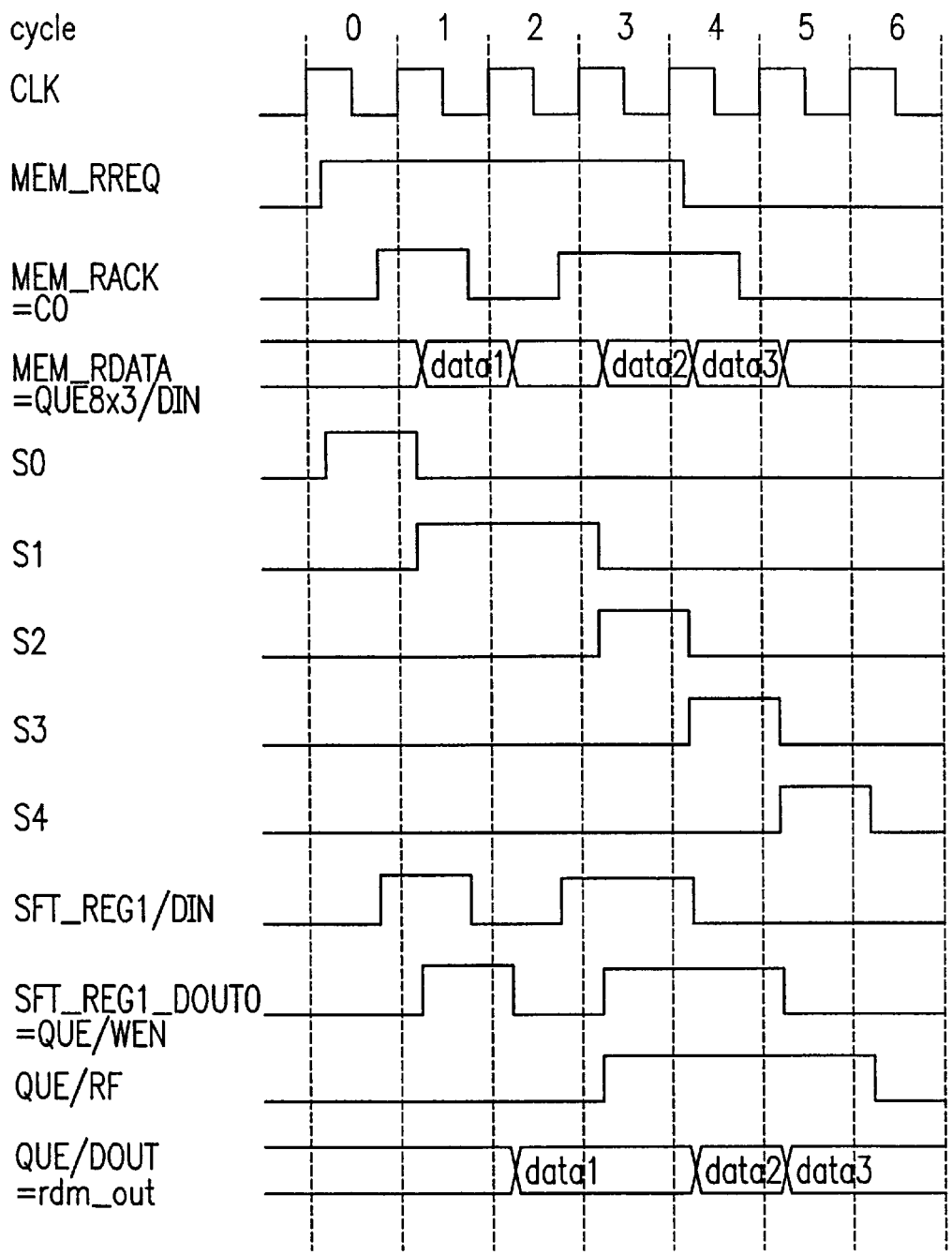
FIG. 23 is a timing diagram illustrating an operation timing of the thread shown in FIG. 20.

An operation of the thread shown in FIG. 20 will be described with reference to FIGS. 20 and 23. FIG. 23 is a timing diagram illustrating an operation of the thread shown in FIG. 20.

In cycle 0, the thread is in state S0, and the thread changes the memory read request signal MEM_RREQ 155 to be "1" (active). In cycle 0, the memory read request from the thread is immediately accepted and the memory read request acceptance signal MEM_RACK 215 is changed to be "1" (active). Therefore, the signal input to the input DIN 336 of the shift register 312 included in the read timing generation circuit 311 is changed to be "1", and the thread is placed into state S1 in cycle 1.

In cycle 1, the thread is in state S1, and the thread changes the memory read request signal MEM_RREQ 155 to be "1" (active). However, the memory read request from the thread is not accepted, and the memory read request acceptance signal MEM_RACK 215 is changed to be "0" (inactive). Therefore, the thread is kept in state S1 in cycle 2 without being placed into state S2.

In cycle 1, the signal output from the output DOUT0 338 of the shift register 312 included in the read timing generation circuit 311 is changed to be "1". Since the output DOUT0 338 is connected to the input WEN 340 of the queue 339 included in the read data storage circuit 304, data1 which is read from the memory interface is written into the queue 339 in cycle 1.

In cycle 2, the thread is in state S1, and the thread changes the memory read request signal MEM_RREQ 155 to be "1" (active). In cycle 2, the memory read request from the thread is immediately accepted and the memory read request acceptance signal MEM_RACK 215 is changed to be "1" (active). Therefore, the signal input to the input DIN 336 of the shift register 312 included in the read timing generation circuit 311 is changed to be "1", and the thread is placed into state S2 in cycle 3.

In cycle 3, the thread is in state S2, and memory read is performed in correspondence with the first memory read request. Since the output rdm_out 343 of the read data storage and selection circuit 324 is connected to the output DOUT of the queue 339, data1 which is output from the queue 339 is used by the thread as read data.

In cycle 3, the memory read request acceptance signal MEM_RACK 215 is "1" (active). Therefore, the signal input to the input RF 523 of the queue 339 becomes "1", and thus data which is output from the output DOUT 341 of the queue 339 in cycle 4 is data2.

In cycle 3, the thread is in state S2, and the thread changes the memory read request signal MEM_RREQ 155 to be "1" (active). In cycle 3, the memory read request from the thread is immediately accepted and the memory read request acceptance signal MEM_RACK 215 is changed to be "1" (active). Therefore, the signal input to the input DIN 336 of the shift register 312 included in the read timing generation circuit 311 is changed to be "1", and the thread is placed into state S3 in cycle 4.

In cycle 3, the signal output from the output DOUT0 338 of the shift register 312 included in the read timing generation circuit 311 is changed to be "1". Since the output DOUT0 338 is connected to the input WEN 340 of the queue 339 included in the read data storage circuit 304, data2 which is read from the memory interface is written into the queue 339 in cycle 3.

In cycle 4, the thread is in state S3, and memory read is performed in correspondence with the second memory read request. Since the output rdm_out 343 of the read data storage and selection circuit 324 is connected to the output DOUT of the queue 339, data2 which is output from the queue 339 is used by the thread as read data.

In cycle 4, the signal output from the output DOUT0 338 of the shift register 312 included in the read timing generation circuit 311 becomes "1" (active). Since the output DOUT0 338 is connected to the input WEN 340 of the queue 339 in the read data storage circuit 304, data3 which is read from the memory interface is written into the queue 339 in cycle 4.

In cycle 4, the thread is in state S3. Therefore, the signal input to the input RF 523 of the queue 339 becomes "1", and thus data which is output from the output DOUT 341 of the queue 339 in cycle 5 is data3.

In cycle 5, the thread is in state S4, and memory read is performed in correspondence with the third memory read request. Since the output rdm_out 343 of the read data storage and selection circuit 324 is connected to the output DOUT of the queue 339, data3 which is output from the queue 339 is used by the thread as read data.

As described above, in a circuit generated in the second example, data which is read from a memory with the correct timing is once stored in a read data storage circuit including a queue. When required by a thread, the data stored in the queue is read. Thus, the common memory can be accessed in a pipeline manner, and memory access competition among the plurality of threads is mediated.

Figure 4:
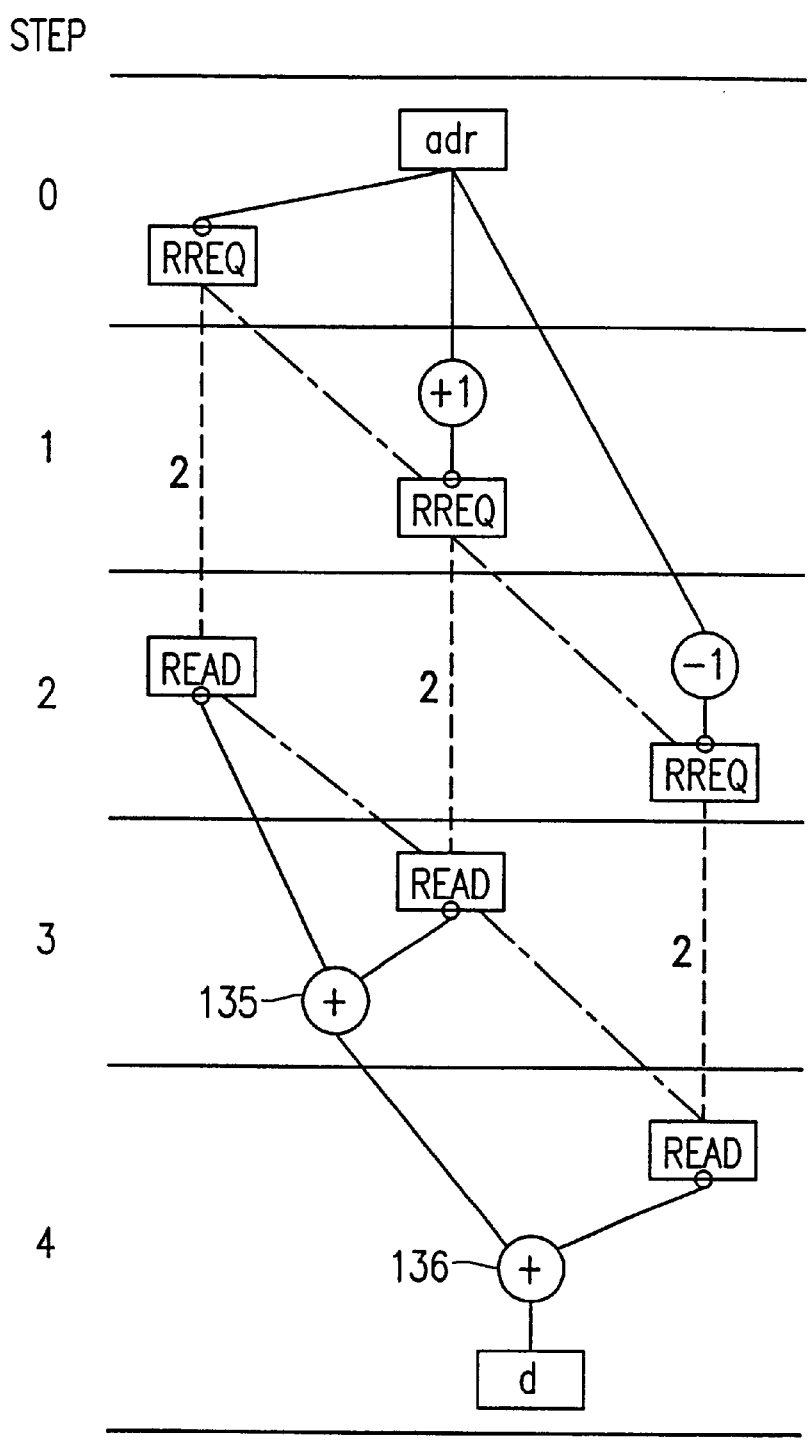
FIG. 4 shows exemplary scheduling by high level synthesis.
Figure 5:
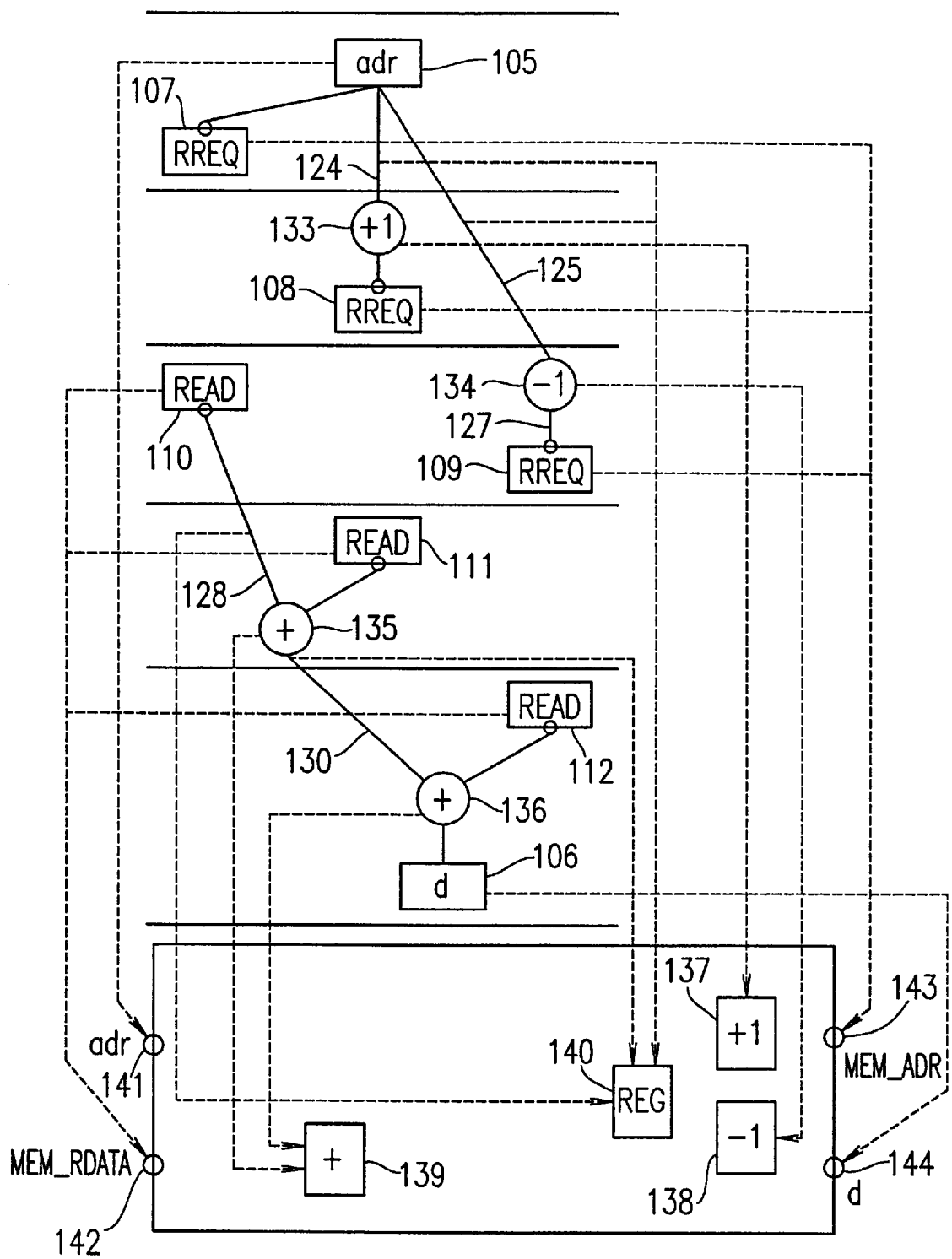
FIG. 5 shows exemplary allocation by high level synthesis.
Figure 6:
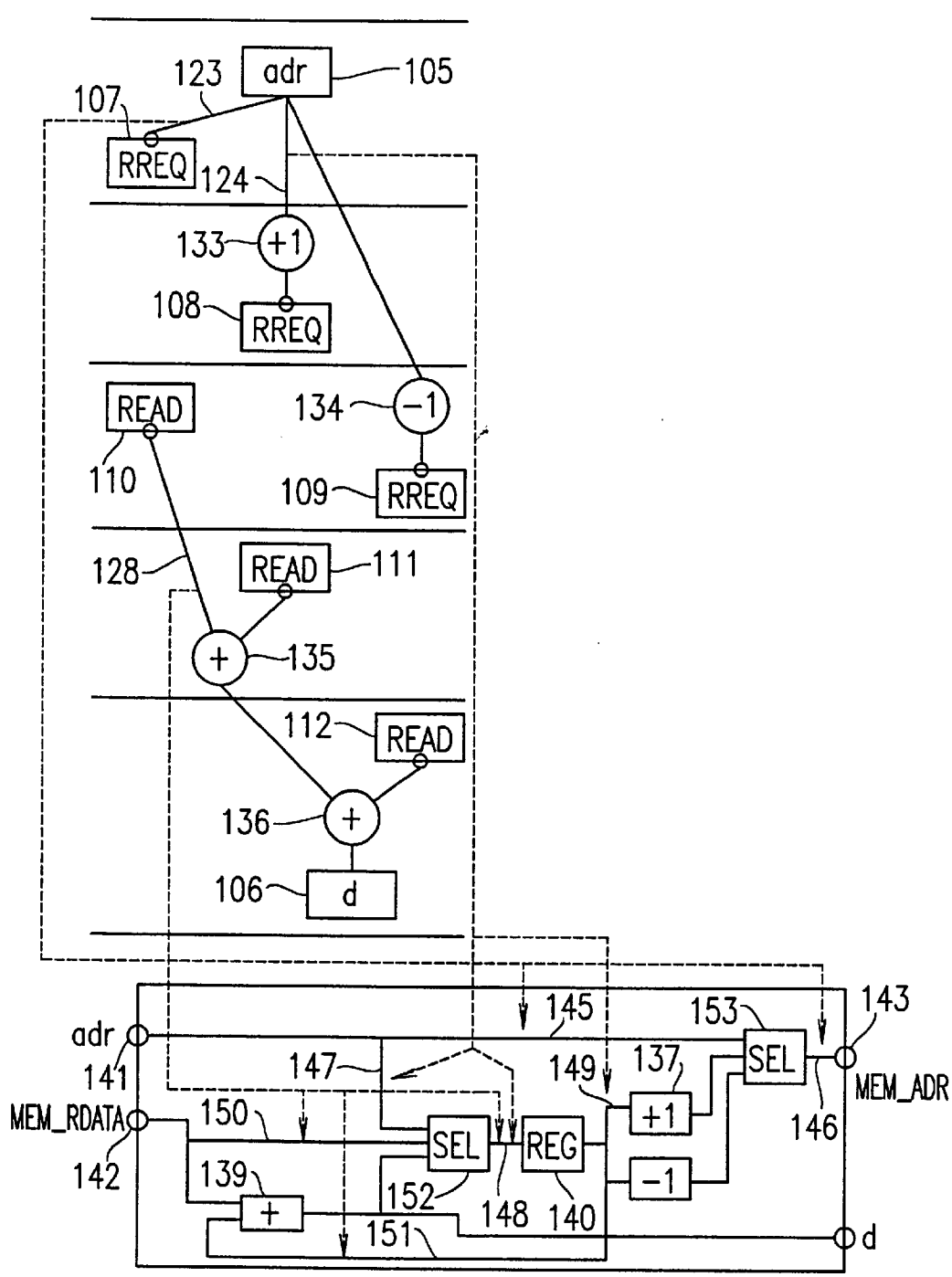
FIG. 6 shows exemplary data path generation by high level synthesis.

In order to obtain the scheduling result shown in FIG. 4 from the operation description shown in FIG. 1, a pipeline memory having a latency of 1 needs to be used, for the following reason. The data which is read from the memory via the memory interface by the thread is once stored in the queue, and the output from the queue is used as the read data. Therefore, an overhead of one clock cycle is generated.

In order to use a pipeline memory having a latency of 2, a data dependency edge having a relative step number of 3 needs to be provided between the memory read request node and the read data node corresponding to the memory read request node during the conversion of the operation description to CDFG, for the purpose of performing scheduling. In this case, the latency for memory access is extended, which may reduce the operating speed of the circuit. The account of this phenomenon can be improved by a method for generating a circuit according to a third example of the present invention.

Example 3

Figure 24:
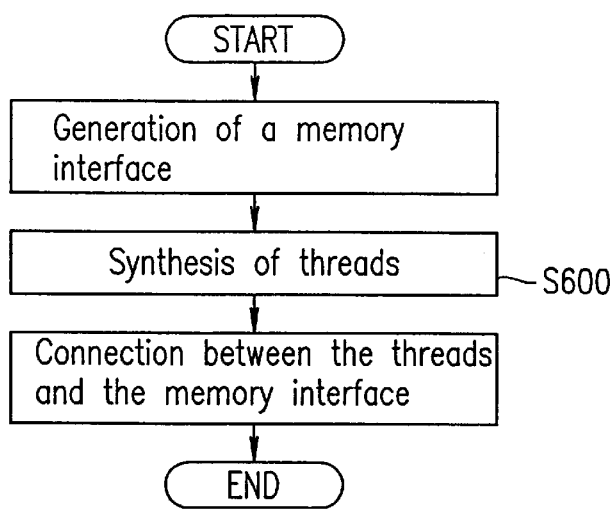
FIGS. 24 through 26 are each a flowchart illustrating a method for generating a circuit according to a third example of the present invention.

FIG. 24 is a flowchart illustrating a method for generating a circuit according to the third example of the present invention. A circuit generated in the third example includes a plurality of threads operating in parallel so as to access a common pipeline-accessible memory, and a memory interface which is connected to each of the threads. It is determined whether or not the finite state transfer machine has been continuously transferred. Based on the determination result, either data read from the memory or data stored in the read data storage circuit is selected. Thus, memory access can be performed with a latency which is equal to the latency of the memory.

Referring to FIG. 24, generation of a memory interface, synthesis of threads (S600), and connection between the threads and the memory interface are performed in this order. The generation of a memory interface, and connection between the threads and the memory interface are substantially the same as those described in the second example with reference to FIG. 17. The synthesis of threads (S600) is different from that of the second example.

In a stage of synthesis of threads (S600), threads of an RTL (register transfer level) are independently generated by a high level synthesis method.

Figure 25:
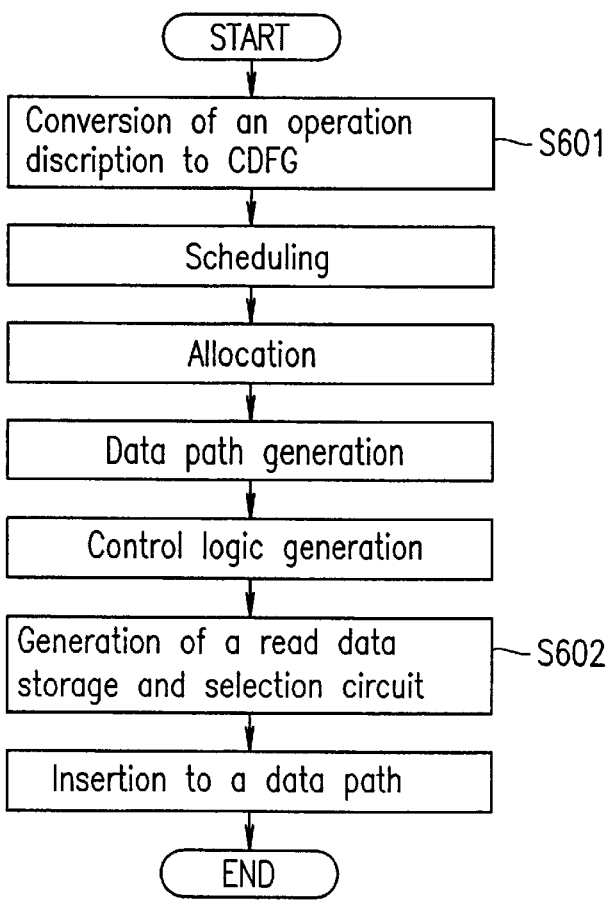

FIG. 25 is a flowchart illustrating a high level synthesis method for generating threads in the third example. As shown in FIG. 25, conversion of an operation description to CDFG (S601), scheduling, allocation, data path generation, control logic generation, generation of a read data storage and selection circuit (S602), and insertion to a data path are performed in this order. The scheduling, allocation, data path generation, control logic generation, and insertion to a data path are substantially the same as those described in the second example with reference to FIG. 18. The conversion of an operation description to CDFG (S601), and generation of a read data storage and selection circuit (S602) are different from those of the second example.

The circuit generated in this example operates as follows. It is determined whether or not the finite state transfer machine has been continuously transferred. Based on the determination result, it is selected, by a read data selection circuit, whether data read from the common memory is directly used or data stored in the read data storage circuit is used. Accordingly, a data dependency edge having a relative step number of n is provided between the memory read request node and the read data node corresponding to the memory read request node during the conversion of an operation description to CDFG (S601). Except for this point, the conversion of an operation description to CDFG (S601) is substantially the same as that of the second example. Here, "n" is a latency of the pipeline-accessible memory used.

In a stage of generation of a read data storage and selection circuit (S602), a read data storage and selection circuit for temporarily storing data which has been read from the memory interface is generated.

Figure 26:
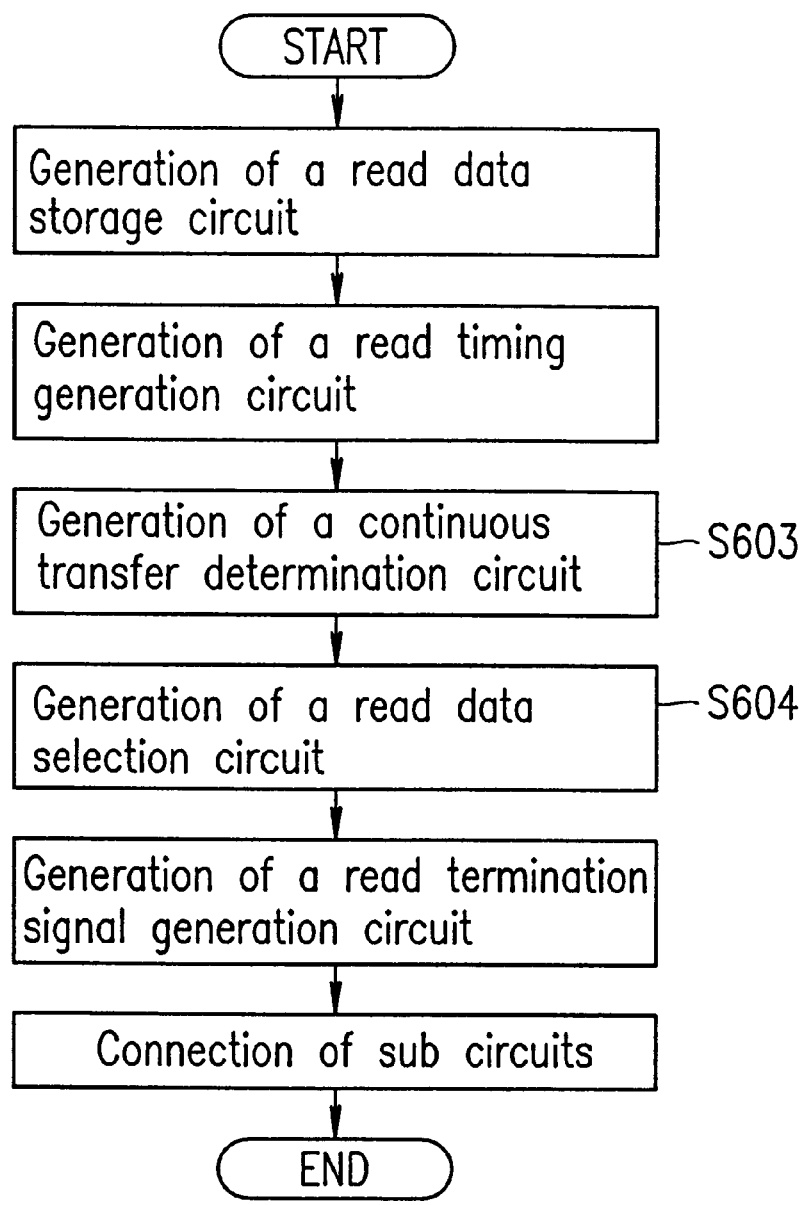

FIG. 26 is a flowchart illustrating the generation of a read data storage and selection circuit in the third example. As shown in FIG. 26, generation of a read data storage circuit, generation of a read timing generation circuit, generation of a continuous transfer determination circuit (S603), generation of a read data selection circuit (S604), generation of a read termination signal generation circuit, and connection of sub circuits are performed in this order. The generation of a read data storage circuit, generation of a read timing generation circuit, generation of a read termination signal generation circuit, and connection of sub circuits are substantially the same as those described in the second example with reference to FIG. 19. The generation of a continuous transfer determination circuit (S603), and generation of a read data selection circuit (S604) are different from those of the second example.

In the case where the finite state transfer machine included in the thread is continuously transferred from the time of acceptance by the memory interface of the memory read request until the time of execution of the memory read corresponding to the memory read request, data is directly read from the memory interface by the thread and used. By contrast, in the case where the finite state transfer machine included in the thread is not continuously transferred, data stored in the queue is read by the thread and used. Therefore, in a stage of generation of a continuous transfer determination circuit (S603), a continuous transfer determination circuit is generated for determining whether or not the finite state transfer machine has been continuously transferred and generating a determination signal. For the determination, a shift register is used.

In a stage of generation of a read data selection circuit (S604), a read data selection circuit is generated for selecting either data read from the memory via the memory interface or data read from the queue based on the determination signal which is output from the continuous transfer determination circuit.

Figure 27:
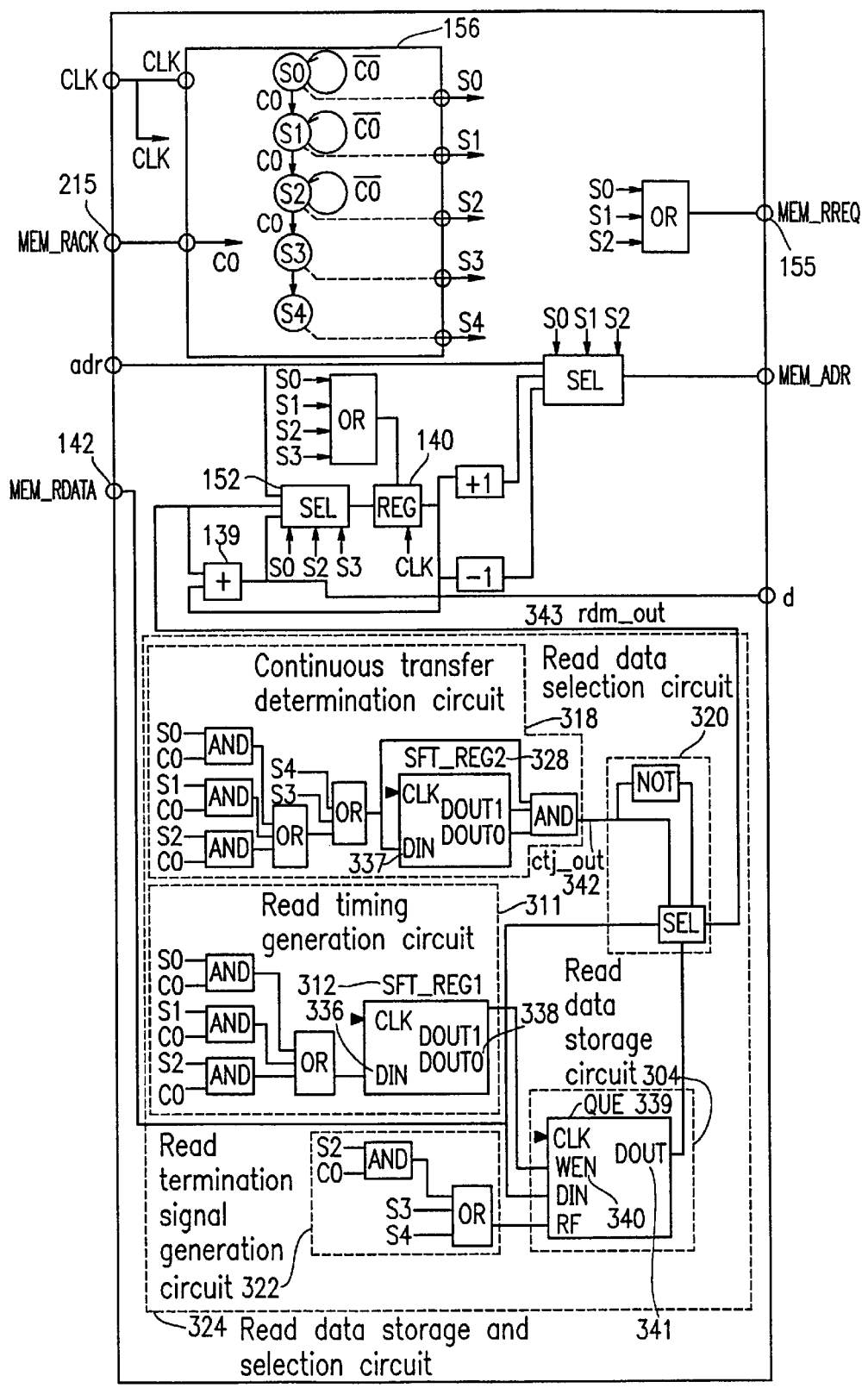
FIG. 27 shows a configuration of a thread generated in the third example of the present invention.

FIG. 27 shows an exemplary configuration of a thread generated by the high level synthesis method according to the third example. Here, it is assumed that a pipeline memory having a latency of 2 is used. In the third example, the CDFG generated from the operation description shown in FIG. 1 is substantially the same as that in FIG. 2, the scheduling result is substantially the same as that in FIG. 4, the allocation result is substantially the same as that in FIG. 5, and the data path generation result is substantially the same as that in FIG. 6.

The thread shown in FIG. 27 includes, in addition to the circuit shown in FIG. 20, a continuous transfer determination circuit 318 and a read data selection circuit 320. The continuous transfer determination circuit 318 and a read data selection circuit 320 are both included in the read data storage and selection circuit 324.

The continuous transfer determination circuit 318 includes four AND circuits, two OR circuits, and a shift register 328. Two inputs of a first AND circuit respectively receive state S0 which is output from the finite state transfer machine 156 and a memory read request acceptance signal MEM_RACK (CO). Two inputs of a second AND circuit respectively receive state S1, which is output from the finite state transfer machine 156, and the memory read request acceptance signal MEM_RACK (CO). Two inputs of a third AND circuit respectively receive state S2, which is output from the finite state transfer machine 156, and the memory read request acceptance signal MEM_RACK (CO). An output of each of first, second and third AND circuits is connected to an input of a first OR circuit. An output of the first OR circuit is connected to an input of a second OR circuit. An output of the second OR circuit is branched into two, and connected to an input DIN 337 of the shift register 328 and an input of a fourth AND circuit. An input CLK of the shift register 328 receives a clock signal. Outputs DOUT0 and DOUT1 of the shift register 328 are connected to an input of the fourth AND circuit. A shift register of the read timing generation circuit 311 has two outputs DOUT0 and DOUT1 in order to be synchronized in the operation timing with the shift register 328. The output DOUT1 is not connected to any external device.

The read data selection circuit 320 includes a NOT circuit and a selector. An output ctj_out 342 of the fourth AND circuit of the continuous transfer determination circuit 318 is branched into two, and connected to an input of the NOT circuit and an input of the selector. Another input of the selector is connected to an output of the NOT circuit, the input pin 142 for receiving read data MEM_RDATA, and the output DOUT of the read data storage circuit 304 including the queue 339. An output of the selector is connected to the output rdm_out 343 of the read data storage and selection circuit 324, and the output 343 is connected to one of the inputs of the adder 139 and the input of the selector 152.

Figure 28:
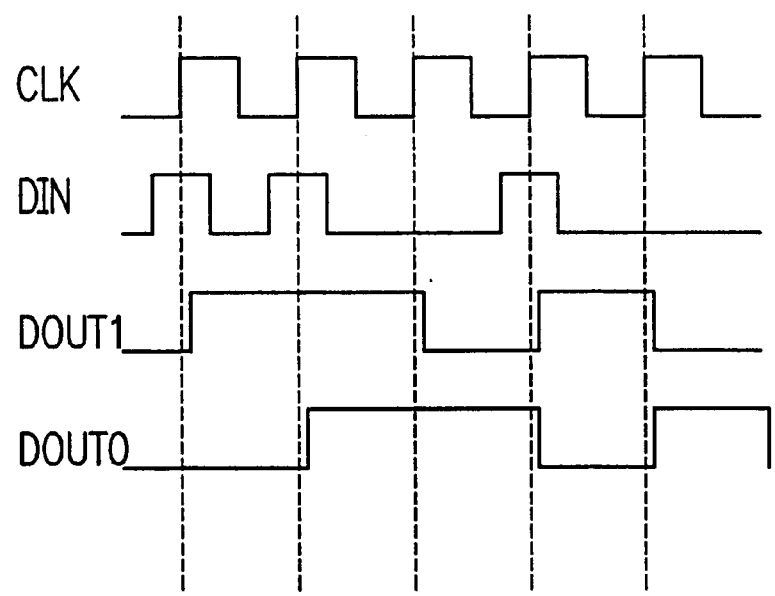
FIG. 28 is a timing diagram illustrating an operation timing of a shift register in a circuit generated in the third example of the present invention.

FIG. 28 is a timing diagram illustrating an access timing of the shift registers 312 and 328. The shift registers 312 and 328 are two-bit shift registers. Each time the signal input to the input CLK rises, a value of the signal output from the output DOUT1 is substituted for the output DOUT0, and a value of the signal input to the input DIN is substituted for the output DOUT1.

Figure 29:
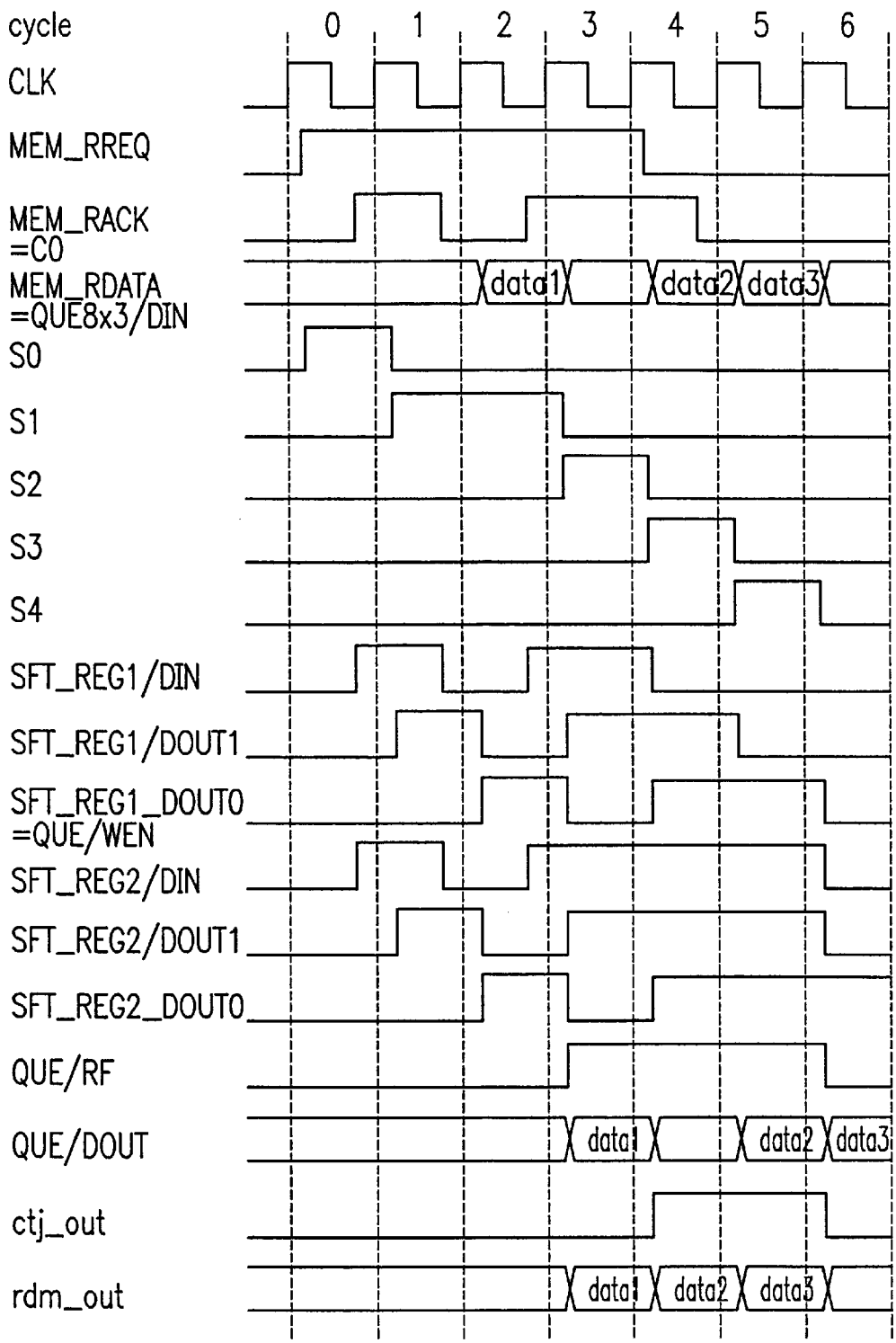
FIG. 29 is a timing diagram illustrating an operation timing of the thread shown in FIG. 27.

An operation timing of the thread shown in FIG. 27 will be described with reference to FIGS. 27 and 29. FIG. 29 is a timing diagram illustrating an operation of the thread shown in FIG. 27.

In cycle 0, the thread is in state S0, and the thread changes the memory read request signal MEM_RREQ 155 to be "1" (active). In cycle 0, the memory read request from the thread is immediately accepted and the memory read request acceptance signal MEM_RACK 215 is changed to be "1" (active). Therefore, the signal input to the input DIN 336 of the shift register 312 included in the read timing generation circuit 311 and the signal input to the input DIN 337 of the shift register 328 included in the continuous transfer determination circuit 318 are changed to be "1", and the thread is placed into state S1 in cycle 1.

In cycle 1, the thread is in state S1, and the thread changes the memory read request signal MEM_RREQ 155 to be "1" (active). However, the memory read request from the thread is not accepted, and the memory read request acceptance signal MEM_RACK 215 is changed to be "0" (inactive). Therefore, the thread is kept in state S1 in cycle 2 without being placed into state S2.

In cycle 1, the thread is in state S1 and the memory read request acceptance signal MEM_RACK 215 is "0" (inactive). Therefore, the signal input to the input DIN 337 of the shift register 328 included in the continuous transfer determination circuit 318 becomes "0".

In cycle 2, the thread is in state S1, and the thread changes the memory read request signal MEM_RREQ 155 to be "1" (active). In cycle 2, the memory read request from the thread is immediately accepted and the memory read request acceptance signal MEM_RACK 215 is changed to be "1" (active). Therefore, the signal input to the input DIN 336 of the shift register 312 included in the read timing generation circuit 311 is changed to be "1", and the thread is placed into state S2 in cycle 3.

In cycle 2, the signal output from the output DOUT0 338 of the shift register 312 included in the read timing generation circuit 311 becomes "1". Since the output DOUT0 338 is connected to the input WEN 340 of the queue 339 included in the read data storage circuit 304, data1 which is read from the memory interface is written into the queue 339 in cycle 2. In cycle 3, data1 which is read from the output 341 of the queue 339 is output.

In cycle 2, the thread is in state S1 and the memory read request acceptance signal MEM_RACK 215 is "1" (active) Therefore, the signal input to the input DIN 337 of the shift register 328 included in the continuous transfer determination circuit 318 becomes "1".

In cycle 3, the thread is in state S2 and the memory read request acceptance signal MEM_RACK 215 is "1" (active) Therefore, the signal input to the input DIN 337 of the shift register 328 included in the continuous transfer determination circuit 318 becomes "1".

Therefore, in cycle 3, the signal output from the output ctj_out 342 of the continuous transfer determination circuit 318 is "0", and the read data selection circuit 320 selects data output from the output 341 of the queue 339. Thus, output data1 from the queue 339 is output from the output rdm_out 343 of the read data storage and selection circuit 324.

In cycle 3, the thread is in state S2, and the memory read request acceptance signal MEM_RACK 215 is "1" (active). Therefore, the signal input to the input DIN 337 of the shift register 328 included in the continuous transfer determination circuit 318 becomes "1".

In cycle 3, the memory read request is accepted and the memory read request acceptance signal MEM_RACK 215 becomes "1" (active). Therefore, the signal input to the input DIN 336 of the shift register 312 included in the read timing generation circuit 311 becomes "1". In cycle 4, the thread is placed into state S3.

In cycle 4, the thread is in state S3. Therefore, the signal input to the input DIN 337 of the shift register 328 included in the continuous transfer determination circuit 318 becomes "1".

Therefore, in cycle 4, the signal output from the output ctj_out 342 of the continuous transfer determination circuit 318 becomes "1", and the read data selection circuit 320 selects data MEM_RDATA from the memory interface. Thus, data2 from the memory interface is output from the output rdm_out 343 of the read data storage and selection circuit 324.

Similarly in cycle 5, the signal output from the output ctj_out 342 of the continuous transfer determination circuit 318 becomes "1", and the read data selection circuit 320 selects data MEM_RDATA from the memory interface. Thus, data3 from the memory interface is output from the output rdm_out 343 of the read data storage and selection circuit 324.

As described above, in a circuit generated in the third example, it is determined whether or not the finite state transfer machine has been continuously transferred. Based on the determination result, either data read from the memory or data stored in the read data storage circuit is selected. Thus, memory access is performed with a latency which is equal to the latency of the memory.

According to the present invention, when a plurality of threads operating in parallel access a common memory simultaneously, mediation can be performed such that access competition among the plurality of threads does not occur.

In an embodiment in which the read data storage and selection circuit including the read data storage circuit and the read timing generation circuit are generated, data which is read from the memory with the correct timing is once stored in the read data storage circuit. Therefore, the thread can read data stored in the read data storage circuit whenever necessary.

In an embodiment in which the read data storage circuit includes the queue and an embodiment in which the read timing generation circuit includes the shift register, the area of the circuit can be reduced.

In an embodiment in which the read data storage and selection circuit includes the continuous transfer determination circuit and the read data selection circuit, it is determined whether or not the finite state transfer machine included in the thread has been continuously transferred. Based on the determination result, either one of the data read from the memory or the data stored in the read data storage circuit is selected. Therefore, the memory access can be performed with a latency which is equal to the latency of the memory.

In an embodiment in which the continuous transfer determination circuit includes the shift register, the area of the circuit can be reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A high level synthesis method for generating a logic circuit of a register transfer level from an operation description, the method comprising:

a control data flowgraph generation stage of analyzing the operation description describing a processing operation and not including information regarding a hardware structure, and generating a control data flowgraph which represents a dependency relationship among calculations, input to and output from an external device, and a memory access execution order;

a scheduling stage of scheduling each of a plurality of nodes of the control data flowgraph to a step corresponding to a state of a controller;

an allocation stage of generating a calculator, a register, and input and output pins which are required to execute the scheduled control data flowgraph, and allocating a calculation of the control data flowgraph to the calculator, allocating a data dependency edge crossing a border between steps to the register, and allocating an external input, an external output and a memory access to the input and output pins;

a data path generation stage of generating a data path corresponding to the data dependency edge of the control data flowgraph and generating a selector when necessary; and a control logic generation stage of generating a control logic for controlling the register and the selector generated in the allocation stage and the data path generation stage, wherein when generating a thread sharing a common memory with another thread operating in parallel therewith, a memory access request is represented by a node of the control data flowgraph so as to perform scheduling, and a control logic is generated, which outputs a memory access request signal to a common memory interface in a state corresponding to a step to which the node is scheduled, and which keeps the state until a memory access request acceptance signal from the common memory interface is changed to be active.

2. A high level synthesis method according to claim 1, further comprising the stage of generating a read data storage and selection circuit, which includes a read data storage circuit for temporarily storing data which is read from the common memory and a read timing generation circuit for generating a timing for reading the data from the common memory.

3. A high level synthesis method according to claim 2, wherein the read data storage and selection circuit includes a continuous transfer determination circuit for determining whether or not a finite state transfer machine included in the thread has been continuously transferred, and a read data selection circuit for selecting whether data which is read from the common memory is to be used or data which is stored in the read data storage circuit is to be used.

4. A high level synthesis method according to claim 2, wherein the read data storage circuit includes a queue.

5. A high level synthesis method according to claim 2, wherein the read timing generation circuit includes a shift register.

6. A high level synthesis method according to claim 3, wherein the continuous transfer determination circuit includes a shift register.

7. A thread generated using a high level synthesis method according to claim 1.

8. A method for generating a circuit including a plurality of threads which are generated using a high level synthesis method according to claim 1 and a common memory interface connected to each of the plurality of threads, the method comprising the stages of:

generating the common memory interface for, when the plurality of threads send a read request signal, accepting a read request signal from a thread having a highest priority, among the plurality of threads having an active read request signal, and changing a request acceptance signal to the selected thread to be active;

generating the plurality of threads; and connecting the plurality of threads with the common memory interface.

* * * * *